(12) United States Patent
Xu et al.

(10) Patent No.: US 12,199,105 B2
(45) Date of Patent: Jan. 14, 2025

(54) DISPLAY PANEL, DISPLAY DEVICE AND VIRTUAL REALITY DEVICE

(71) Applicant: BOE Technology Group Co., Ltd., Beijing (CN)

(72) Inventors: Zhiqiang Xu, Beijing (CN); Weixing Liu, Beijing (CN); Chunfang Zhang, Beijing (CN); Wanpeng Teng, Beijing (CN); Jintao Peng, Beijing (CN); Kai Guo, Beijing (CN); Meirong Lu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/021,902

(22) PCT Filed: May 24, 2022

(86) PCT No.: PCT/CN2022/094656
§ 371 (c)(1),
(2) Date: Feb. 17, 2023

(87) PCT Pub. No.: WO2023/225841
PCT Pub. Date: Nov. 30, 2023

(65) Prior Publication Data
US 2024/0266358 A1 Aug. 8, 2024

(51) Int. Cl.
*G02F 1/1343* (2006.01)
*G02F 1/133* (2006.01)
(Continued)

(52) U.S. Cl.
CPC ........ *H01L 27/124* (2013.01); *G02F 1/13306* (2013.01); *G02F 1/133621* (2013.01);
(Continued)

(58) Field of Classification Search
CPC ..................................................... G02F 1/1343
See application file for complete search history.

(56) References Cited

U.S. PATENT DOCUMENTS

| | | | |
|---|---|---|---|
| 2009/0190083 A1* | 7/2009 | Lee | G02F 1/134363 349/123 |
| 2013/0070002 A1* | 3/2013 | Hisada | G09G 5/10 362/231 |

(Continued)

*Primary Examiner* — Sang V Nguyen
(74) *Attorney, Agent, or Firm* — Nath, Goldberg & Meyer; Joshua B. Goldberg

(57) ABSTRACT

The embodiment of the present disclosure provides a display panel, which includes an array substrate, a counter substrate and a spacer. The array substrate includes a base substrate and a plurality of signal lines on the base substrate. The plurality of signal lines include a plurality of first signal lines and a plurality of second signal lines. The plurality of first signal lines and the plurality of second signal lines intersect each other to define a plurality of first regions. The plurality of first regions include a plurality of first pixel regions, at least one second pixel region and at least one redundant region. The first signal line extends along a first direction, the second signal line includes a body portion extending along a second direction, at least one second signal line further includes a bending portion connected to the body portion.

19 Claims, 13 Drawing Sheets

(51) Int. Cl.
  *G02F 1/13357* (2006.01)
  *G02F 1/1362* (2006.01)
  *G02F 1/1368* (2006.01)
  *H01L 27/12* (2006.01)

(52) U.S. Cl.
  CPC .. *G02F 1/134309* (2013.01); *G02F 1/136227* (2013.01); *G02F 1/136286* (2013.01); *G02F 1/1368* (2013.01); *G02F 2203/30* (2013.01)

(56) References Cited

U.S. PATENT DOCUMENTS

2014/0104523 A1* 4/2014 Jung ................. G02F 1/1343
  349/41
2016/0307937 A1* 10/2016 Jin .................... H01L 27/124
2018/0314120 A1* 11/2018 Peng ................. G06F 3/0412
2021/0333621 A1* 10/2021 Geng ............... G02F 1/133528
2023/0292552 A1* 9/2023 Mou .................... H10K 71/00

\* cited by examiner

DISPLAY PANEL, DISPLAY DEVICE AND VIRTUAL REALITY DEVICE

This is a National Phase Application filed under 35 U.S.C. 371 as a national stage of PCT/CN2022/094656, filed May 24, 2022, the content of each of which is hereby incorporated by reference in its entirety.

TECHNICAL FIELD

The present disclosure relates to the technical field of display, in particular, to a display panel, a display device and a virtual reality device.

BACKGROUND

With the development of Augmented Reality (AR) and Virtual Reality (VR), the pixel density (i.e., Pixels Per Inch, PPI) required for display devices is increasing. However, for the LCD panels, the high PPI design makes the spacing between the pixels smaller, so that a pixel region is excessively shielded by the spacer and the corresponding black matrix, thereby resulting in a decreased brightness of the pixel region and the poor display.

SUMMARY

Embodiments of the present disclosure provide a display panel, a display device and a virtual reality device.

As a first aspect, an embodiment of the present disclosure provides a display panel, including an array substrate, a counter substrate and a spacer between the array substrate and the counter substrate. The array substrate includes a base substrate and a plurality of signal lines on the base substrate, the plurality of signal lines include a plurality of first signal lines and a plurality of second signal lines, the plurality of first signal lines and the plurality of second signal lines intersect each other to define a plurality of first regions, and the plurality of first regions include a plurality of first pixel regions, at least one second pixel region and at least one redundant region. Each of the plurality of first signal lines extends along a first direction, each of the plurality of second signal lines includes a body portion extending along a second direction, at least one of the plurality of second signal lines further includes a bending portion connected to the body portion, and the first direction intersecting the second direction. The first pixel region is adjacent to the body portion of the at least one second signal line, the second pixel region and the redundant region are on two sides of the bending portion along the first direction, respectively, and the bending portion protrudes towards the redundant region. An area of an orthographic projection of the second pixel region on the base substrate is larger than an area of an orthographic projection of the first pixel region on the base substrate, and the area of the orthographic projection of the first pixel region on the base substrate is larger than an area of an orthographic projection of the redundant region on the base substrate. An orthographic projection of the spacer on the base substrate at least partially overlaps the orthographic projection of the redundant region on the base substrate.

In some embodiments, a ratio of the area of the orthographic projection of the second pixel region on the base substrate to the area of the orthographic projection of the first pixel region on the base substrate ranges from 1.25 to 1.9.

In some embodiments, the array substrate further includes a plurality of pixel electrodes and a plurality of thin film transistors, each of the first pixel region and the second pixel region is provided therein with a corresponding one of the plurality of pixel electrodes and a corresponding one of the plurality of thin film transistors, the pixel electrode is located on a side of the thin film transistor away from the base substrate and is connected to a first electrode of the thin film transistor, and one of a gate electrode and a second electrode of the thin film transistor is connected to the first signal line, and the other of the gate electrode and the second electrode of the thin film transistor is connected to the second signal line. The orthographic projection of the redundant region on the base substrate does not overlap an orthographic projection of the pixel electrode on the base substrate.

In some embodiments, the array substrate further includes a common electrode. The common electrode is on a side of the pixel electrode proximal to the thin film transistor, the common electrode includes a first hollow portion, and the pixel electrode is connected to the first electrode of the thin film transistor through the first hollow portion of the common electrode. The pixel electrode includes a second hollow portion, and an orthographic projection of the second hollow portion on the base substrate overlaps an orthographic projection of the common electrode on the base substrate.

In some embodiments, the array substrate further includes a common electrode on a side of the pixel electrode away from the thin film transistor. The common electrode includes a third hollow portion, and an orthographic projection of the pixel electrode on the base substrate overlaps an orthographic projection of the third hollow portion on the base substrate.

In some embodiments, the plurality of thin film transistors include a first thin film transistor in the first pixel region and a second thin film transistor in the second pixel region, and a width-to-length ratio of a channel of the second thin film transistor is larger than a width-to-length ratio of a channel of the first thin film transistor.

In some embodiments, the channel of the second thin film transistor has a width-to-length ratio in a range from 1.8 to 2.2.

In some embodiments, a ratio of the width-to-length ratio of the channel of the second thin film transistor to the width-to-length ratio of the channel of the first thin film transistor ranges from 1.8 to 2.75.

In some embodiments, one of the first signal line and the second signal line is a data line, and the other of the first signal line and the second signal line is a gate line.

In some embodiments, the first pixel region is a rectangular region having a short side of 4.2 μm to 17 μm in length.

In some embodiments, the orthographic projection of the spacer on the base substrate at least partially overlaps an orthographic projection of the bending portion on the base substrate.

In some embodiments, the display panel includes a plurality of pairs of bending portions, and two bending portions in a same pair of bending portions are respectively in two adjacent second signal lines. A target redundant region is located between the two bending portions in the same pair of bending portions, and the two bending portions in the same pair of bending portions protrude towards the target redundant region.

In some embodiments, the two bending portions in the same pair of bending portions are mirror-symmetric to each other with respect to a symmetry axis extending along the second direction.

In some embodiments, a first pixel electrode has a different shape from a shape of a second pixel electrode, and the first pixel electrode and the second pixel electrode are pixel electrodes in the second pixel regions adjacent to the two bending portions in the same pair of bending portions, respectively.

In some embodiments, the display panel includes a plurality of second pixel regions, and areas of the plurality of second pixel regions are equal to each other.

As a second aspect, an embodiment of the present disclosure provides a display device, including the display panel according to the first aspect.

In some embodiments, the display panel being a liquid crystal display panel, and the display device further includes a backlight module configured to provide light in a plurality of primary colors for the display panel during each display period of the display device; wherein the display period includes multiple sub-phases, the backlight module is configured to emit light in different primary colors during the multiple sub-phases of a same display period, and during each of the multiple sub-phases, an sub-image in a corresponding one of the plurality of primary colors of a target image is displayed, and a driving circuit configured to provide a driving signal to each of the plurality of first regions according to image information of the sub-image in the corresponding primary color of the target image during a corresponding sub-phase of the display period.

In some embodiments, the driving circuit includes a processing sub-circuit configured to determine, during each of the multiple sub-phases, a target luminance of each of the plurality of first regions according to the image information of the sub-image in the corresponding primary color of the target image, and a driving sub-circuit configured to supply the driving signal to each of the plurality of first regions according to the target luminance of the first region.

In some embodiments, the display panel includes at least one to-be-adjusted region, each of the to-be-adjusted regions is between the body portions of the two second signal lines and comprises n second pixel regions and m first pixel regions, wherein the m first pixel regions are on a side of the n second pixel regions along the second direction, and both of m and n are integers greater than 1, and the to-be-adjusted region is defined by the body portions of the two second signal lines and the two first signal lines. In response to that a portion of the sub-image corresponding to the to-be-adjusted region displays a picture with uniform gray scales, a sum of luminous fluxes of the n second pixel regions in the to-be-adjusted region is approximately equal to a sum of luminous fluxes of the m first pixel regions, or in response to that the portion of the sub-image corresponding to the to-be-adjusted region displays a picture with abrupt gray scales and one of the n second pixel regions is located on a boundary on which the gray scales changes significantly, a target luminance of a first target pixel region is a product of a target luminance of the second pixel region located on the boundary and a first ratio, wherein the first target pixel region is one of the m first pixel region in the to-be-adjusted region, the two second signal lines adjacent to the first target pixel region are the same as two second signal lines adjacent to the second pixel region located on the boundary, and the first ratio is a ratio of an area of the first pixel region to an area of the second pixel region.

As a third aspect, an embodiment of the present disclosure provides a virtual reality device including the display device according to the second aspect.

BRIEF DESCRIPTION OF DRAWINGS

The attached drawings, which form a part of the specification, provide a further understanding of the present disclosure together with the following specific embodiments and illustrate the present disclosure, but do not constitute a limitation of the present disclosure. In the attached drawings.

DETAIL DESCRIPTION OF EMBODIMENTS

The present disclosure will now be described in detail with reference to the following embodiments. It should be noted that, the following embodiments described herein are only used to illustrate and explain the present disclosure and are not intended to limit the present disclosure.

In order to make the objects, technical solutions and advantages of the embodiments of the present disclosure more apparent, the technical solutions of the embodiments of the present disclosure will be clearly and completely described below with reference to the drawings of the embodiments of the present disclosure. It is to be understood that the described embodiments are only some not all embodiments of the present disclosure. Other embodiments, which can be derived by a person skilled in the art from the described embodiments of the present disclosure without inventive step, are within the scope of protection of the present disclosure.

Unless otherwise defined, technical or scientific terms used in the embodiments of the present disclosure should have the ordinary meaning as understood by one of ordinary skill in the art to which the present disclosure belongs. The use of "first," "second," and the like in this disclosure is not intended to indicate any order, quantity, or importance, but rather is used to distinguish one element from another. Similarly, the word "include" or "comprise", and the like, means that the element or item preceding the word comprises the element or item listed after the word and its equivalent, but does not exclude other elements or items. The terms "connect" or "couple" and the like are not restricted to physical or mechanical connections, but may include electrical connections, whether direct or indirect. "Upper", "lower", "left", "right", and the like are used only to indicate relative positional relationships, and when the absolute position of the object being described is changed, the relative positional relationships may also be changed accordingly.

With the rapid development of display technologies, Augmented Reality (AR) and Virtual Reality (VR) technologies have attracted wide attention in the market. Liquid crystal display panels may be applied to the AR/VR products. The AR/VR products have high requirements for display panels, such as ultra-high resolution, an ultra-high refresh frequency, and an ultra-fast response. In order to meet the requirement of AR/VR technology for ultra-high resolution of display panels, the support of a high pixel density (i.e., Pixels Per Inch, PPI) technology is required.

Figure 1:
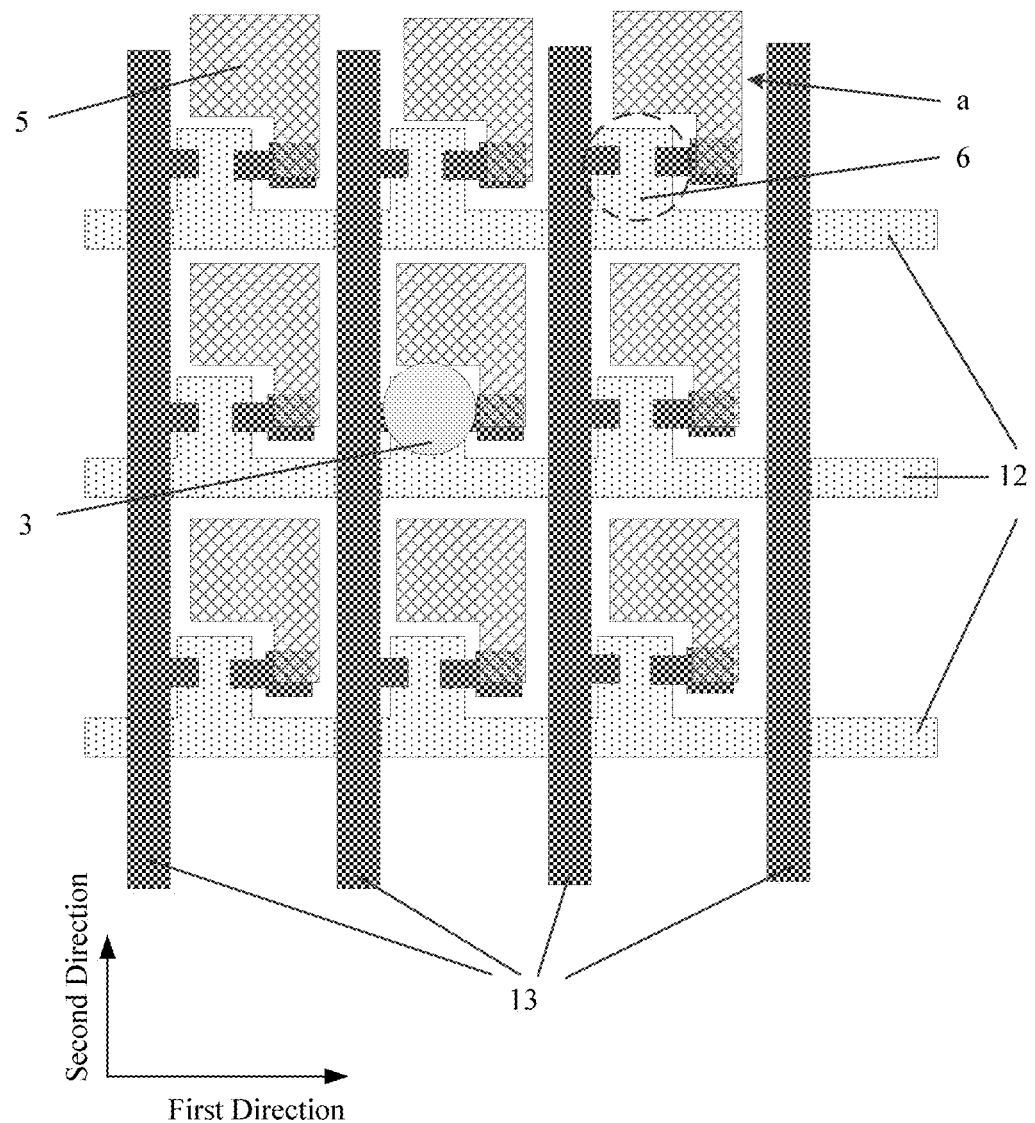
FIG. 1 is a schematic plan view showing an array substrate and spacers.

The liquid crystal display panel includes a counter substrate and an array substrate which are oppositely arranged, and a liquid crystal layer and spacers between the counter substrate and the array substrate. The spacers support the display panel after the array substrate and the counter substrate are aligned and assembled with each other to form a cell. FIG. 1 is a schematic plan view of an array substrate and spacers. As shown in FIG. 1, the array substrate includes a first base substrate (not shown), and a plurality of gate lines 12 extending along a first direction and a plurality of data lines 13 extending along a second direction, which are disposed on the first base substrate. The plurality of gate lines 12 and the plurality of data lines 13 intersect with each other to define a plurality of pixel regions a, and each of the pixel regions a is provided with structures such as a thin film transistor 6 and a pixel electrode. At least a portion of the spacer 3 is located in the pixel region a. The firsdest direction intersects the second direction, for example, the first direction is perpendicular to the second direction. The counter substrate (not shown) may include a second base substrate and a black matrix disposed on the second base substrate. An orthographic projection of the black matrix on the first base substrate overlaps orthographic projections of the gate line, the data line, the thin film transistor, and the spacer 3 on the first base substrate. The black matrix may prevent crosstalk from occurring between various pixel regions and prevent the spacers from adversely affecting the display effect.

When the PPI of the display panel is increased, each of the pixel regions a is correspondingly decreased. In order to ensure the supporting effect of the spacer 3, an area of the orthographic projection of the spacer 3 on the array substrate cannot be decreased, so that a ratio of the area of the spacer 3 and the black matrix corresponding to a pixel region to the area of the pixel region is increased. During the display process of the display panel, the pixel region facing the spacer 3 is shielded by the black matrix corresponding to the spacer 3, so that the brightness of the pixel region is decreased, and the phenomenon of poor display of the display panel occurs.

Figure 2:
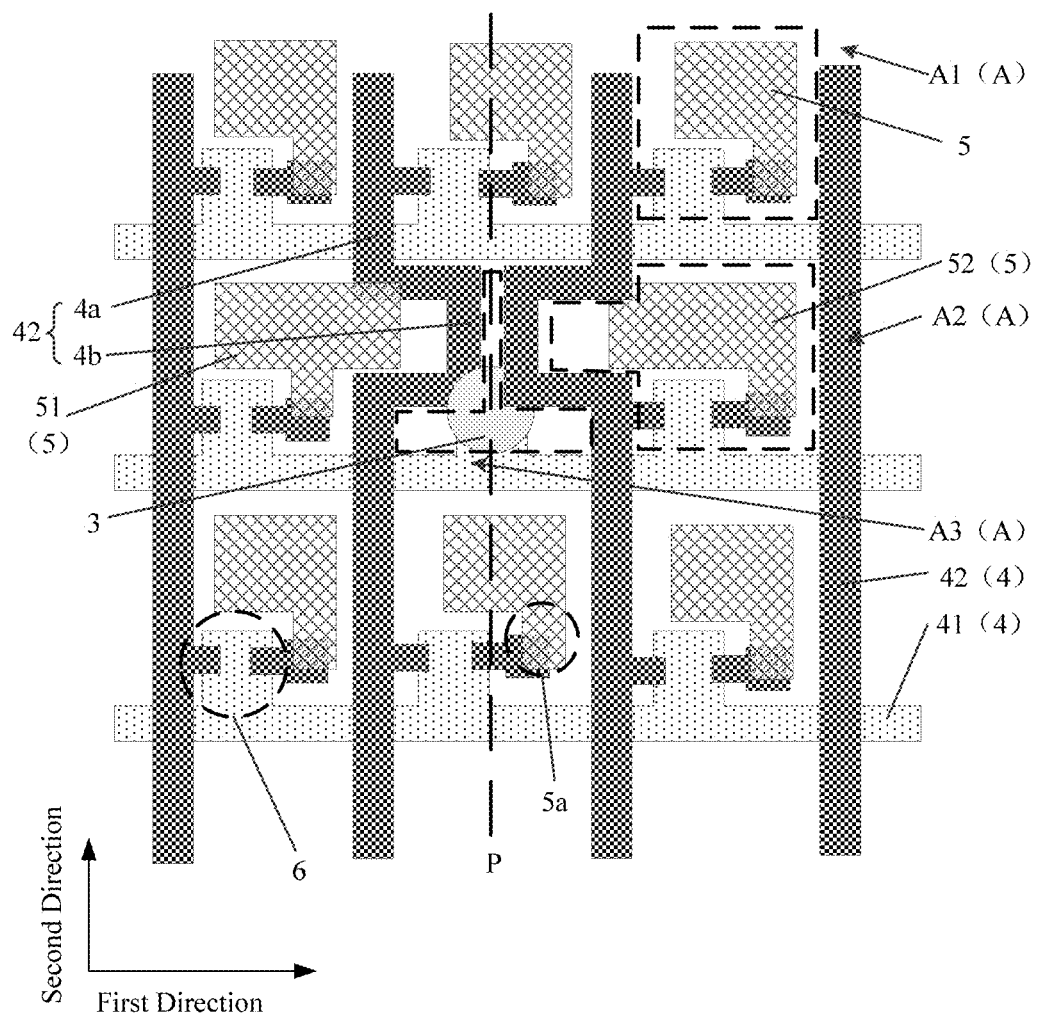
FIG. 2 is a schematic plan view showing an array substrate and spacers according to an embodiment of the present disclosure.
Figure 3:
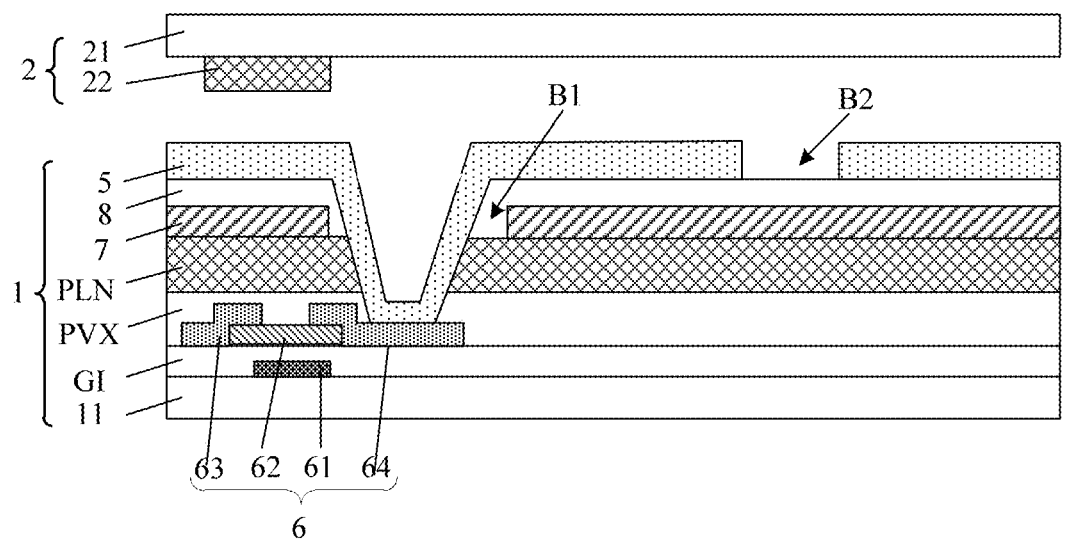
FIG. 3 is a schematic cross-sectional view of a display panel according to an embodiment of the present disclosure.

In order to solve at least one of the above technical problems, an embodiment of the present disclosure provides a display panel including an array substrate, a counter substrate, and spacers located between the array substrate and the counter substrate. FIG. 2 is a schematic plan view of an array substrate and spacers according to an embodiment of the present disclosure, and FIG. 3 is a schematic cross-sectional view of a display panel according to an embodiment of the present disclosure. As shown in FIG. 2 and FIG. 3, the array substrate 1 includes a first base substrate 11 and a plurality of signal lines 4 located on the first base substrate 11. The plurality of signal lines 4 includes a plurality of first signal lines 41 and a plurality of second signal lines 42. The plurality of signal lines 41 are arranged in parallel along a second direction, and the plurality of second signal lines 42 are arranged in parallel along a first direction. The plurality of first signal lines 41 and the plurality of second signal lines 42 intersect with each other to define a plurality of first regions A. The plurality of first regions A include a plurality of first pixel regions A1, at least one second pixel region A2, and at least one redundant region A3. Each of the first pixel region A1 and the second pixel region A2 is provided with a pixel electrode 5 and a thin film transistor 6, so as to realize display through the driving of a driving signal. No pixel electrode or no thin film transistor is formed in the redundant region A3, therefore the redundant region A3 does not have a display function.

Each of the first signal lines 41 extends along the first direction, and each of the second signal lines 42 includes a body portion 4a extending along the second direction, the first direction intersecting with the second direction, for example, the first direction being perpendicular to the second direction. In addition to the body portion 4a, at least one second signal line 42 includes a bending portion 4b connected to the body portion 4a. In some embodiments, some second signal lines 42 include the body portions 4a and the bending portions 4b, and the remaining second signal lines 42 include only the body portions 4a.

The first pixel region A1 is adjacent to the body portion 4a of the at least one second signal line 42. The second pixel region A2 and the redundant region A3 are both adjacent to the bending portion 4b and located on two sides of the bending portion 4b along the first direction, respectively, and the bending portion 4b protrudes toward the redundant region A3. A size of the area of the orthographic projection of the first pixel region A1 on the first base substrate 11 is larger than a size of the area of the orthographic projection of the redundant region A3 on the first base substrate 11, and a size of the area of the orthographic projection of the second pixel region A2 on the first base substrate 11 is larger than a size of the area of the orthographic projection of the first pixel region A1 on the first base substrate 11. An orthographic projection of the spacer 3 on the first base substrate 11 at least partially overlaps an orthographic projection of the redundant region A3 on the first base substrate 11.

In addition, as shown in FIG. 2, the pixel electrode 5 may include a connection portion 5a, and the pixel electrode 5 is connected to the thin film transistor 6 located in the same first region A through the connection portion 5a.

Since no pixel electrode 5 or no thin film transistor 6 is formed in the redundant region A3, the spacer 3 disposed in the redundant region A3 does not affect the display effect of the display panel. Meanwhile, the area of the second pixel region A2 is increased, so that the loss of brightness in the redundant region A3 caused by the loss of the pixel structure can be compensated, and the brightness of the display panel is prevented from being reduced.

In some embodiments, the counter substrate 2 includes a second base substrate 21 and a black matrix 22 on a side of the second base substrate 21 proximal to the array substrate 1. An orthographic projection of the black matrix 22 on the first base substrate 11 overlaps the orthographic projections of the first signal line 41, the second signal line 42 and the spacer 3 on the first base substrate 11. The spacer 3 is located on a side of the black matrix 22 away from the second base substrate 21. Since the spacer 3 is disposed in the redundant region A3, the display effect of the display panel cannot be affected by the spacer 3. A portion of the black matrix opposite to the spacer 3 does not shield the pixel region, so that the display effect of the display panel cannot be affected.

In some embodiments, one of the first signal line 41 and the second signal line 42 is a data line, and the other is a gate line. For example, as shown in FIG. 2, the first signal line 41 is a gate line extending in the first direction, and the second signal line 42 is a data line.

In some embodiments, as shown in FIG. 2, a ratio of an area of the orthographic projection of the second pixel region A2 on the first base substrate 11 to an area of the orthographic projection of the first pixel region A1 on the first base substrate 11 ranges from 1.25 to 1.75. For example, a ratio of the area of the orthographic projection of the second pixel region A2 on the first base substrate 11 to the area of the orthographic projection of the first pixel region A1 on the first base substrate 11 is 1.25, or 1.3, or 1.5, or 1.7, or 1.75.

In an example, as shown in FIG. 2, the first signal line 41 is a gate line, the second signal line 42 is a data line. Three gate lines each extending along the first direction and four data lines are disposed in the region shown in FIG. 2. The four data lines include two first data lines and two second data lines. The two first data lines are adjacent to each other, and each of the two first data lines includes a body portion extending along the second direction and a bending portion connected to the body portion. Each of the second data lines extends along the second direction. The three gate lines and the four data lines intersect each other to form nine first regions. A region between the bending portions of the two first data lines is the redundant region A3; a region between the bending portion of the first data line and the second data line is the second pixel region A2; and a region defined by the intersection of a gate line, the body portion of the first data line, another gate line, and the body portion of the second data line is the first pixel region A1. When the area of the second pixel region A2 is 1.5 times the area of the first pixel region A1 and the second pixel region A2 receives the same backlight illumination as the first pixel region A1, the light flux passed through the second pixel region A2 is also 1.5 times the light flux passed through the first pixel region A1, and then the sum of the light fluxes for the two second pixel regions A2 and the redundant region A3 located on one side of the first signal line 41 is equal to the sum of the light fluxes for the three first pixel regions A1 located on the other side of the first signal line 41. Therefore, by enlarging the area of the second pixel region A2 located at the two sides of the redundant region A3, the loss of brightness in the redundant region A3 caused by the pixel missing can be compensated, and the phenomenon of poor display of the display panel can be avoided.

In some embodiments, as shown in FIG. 3, the array substrate 1 includes a plurality of pixel electrodes 5 and a plurality of thin film transistors 6. Each of the first pixel region A1 and the second pixel region A2 is provided with the pixel electrode 5 and the thin film transistor 6. The thin film transistor 6 includes a gate electrode 61, an active layer 62, a first electrode 64, and a second electrode 63. The active layer 62 is disposed on a side of the gate electrode 61 away from the first base substrate 11, and a gate insulating layer GI is disposed between the gate electrode 61 and the active layer 62. The first electrode 64 and the second electrode 63 are respectively disposed at two ends of the active layer 62. In addition, one of the first electrode 64 and the second electrode 63 is a source electrode, and the other is a drain electrode. It should be noted that the thin film transistor in FIG. 3 is a bottom-gate thin film transistor as an example, but the thin film transistor can alternatively be a top-gate thin film transistor.

The pixel electrode 5 is located on a side of the thin film transistor 6 away from the first base substrate 11 and is connected to the first electrode 64 of the thin film transistor 6. One of the gate electrode 61 and the second electrode 63 of the thin film transistor 6 is connected to the first signal line 41, and the other of the gate electrode 61 and the second electrode 63 of the thin film transistor 6 is connected to the second signal line 42. The orthographic projection of the redundant region A3 on the first base substrate 11 does not overlap the orthographic projection of the pixel electrode 5 on the first base substrate 11, that is, no pixel electrode is disposed in the redundant region A3, so that the redundant region has no display function.

In some embodiments, as shown in FIG. 3, the array substrate 1 further includes a common electrode 7. When a voltage difference is generated between the common electrode 7 and the pixel electrode 5, an electric field is generated therebetween, so as to drive liquid crystals in a region (i.e., a first pixel region or a second pixel region) where the pixel electrode is located to deflect, thereby achieving a display effect.

As shown in FIG. 3, the common electrode 7 is located on a side of the pixel electrode 5 proximal to the thin film transistor 6. The common electrode 7 includes a first hollow portion B1, and the pixel electrode 5 is connected to the first electrode of the thin film transistor 6 through the first hollow portion B1 of the common electrode 7. The pixel electrode 5 includes a second hollow portion B2, and an orthographic projection of the second hollow portion B2 on the first base substrate 11 overlaps an orthographic projection of the common electrode 7 on the first base substrate 11. When an electric field is generated between the common electrode 7 and the pixel electrode 5, the electric field passes through the second hollow portion B2 of the pixel electrode 5 to drive the liquid crystals to deflect.

The embodiment of the present disclosure does not limit the number and the shape of the second hollow portion B2 of the pixel electrode 5. For example, the second hollow portion B2 may have a rectangular shape, a circular shape, an irregular shape, or the like. For another example, the pixel electrode in each of the first pixel regions A1 includes one second hollow portion B2, and the pixel electrode in each of the second pixel regions A2 includes two second hollow portions B2.

In an example, the pixel electrode 5 may not include the hollow portion. An electric field formed between the common electrode 7 and the pixel electrode 5 may pass through a spacing region between the pixel electrodes 5 to drive the liquid crystals to deflect, thereby achieving the display effect.

Figure 4:
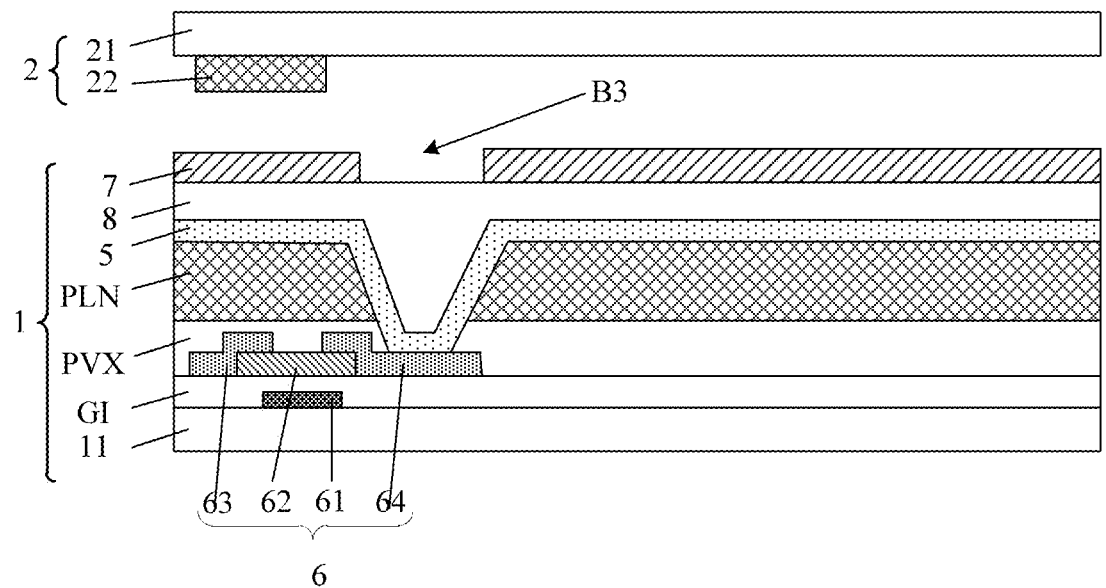
FIG. 4 is a schematic cross-sectional view of a display panel according to another embodiment of the present disclosure.

FIG. 4 is a schematic cross-sectional view of a display panel according to another embodiment of the present disclosure. In other embodiments, as shown in FIG. 4, the array substrate 1 also includes the common electrode 7, the embodiment in FIG. 4 is different from that in FIG. 3 in that the common electrode 7 is located on a side of the pixel electrode 5 away from the thin film transistor 6. The common electrode 7 includes a third hollow portion B3, and an orthographic projection of each of the pixel electrodes 5 on the first base substrate 11 overlaps an orthographic projection of the third hollow portion B3 on the first base substrate 11. When an electric field is generated between the common electrode 7 and the pixel electrode 5, the electric field passes through the third hollow portion B3 of the common electrode 7 to drive the liquid crystals to deflect, so that the display effect can be realized.

The number and shape of the third hollow portions B3 and the correspondence relationship between the pixel electrode and the third hollow portion B3 are not limited in the embodiments of the present disclosure. For example, the shape of the third hollow portion B3 may have a rectangle shape, a circle shape, an irregular shape, or the like. For example, each of the pixel electrodes is opposite to one third hollow portion B3. For another example, each of the pixel electrodes is opposite to a plurality of third hollow portions B3. For yet another example, multiple pixel electrodes are opposite to a same third hollow portion B3.

As shown in FIG. 3 and FIG. 4, the pixel electrode 5 and the common electrode 7 in the array substrate 1 may be positioned flexibly. That is, the pixel electrode 5 and the common electrode 7 is formed in sequence in this order on a side of the thin film transistor 6 away from the first base substrate 11, or the common electrode 7 and the pixel electrode 5 is formed in sequence in this order on a side of the thin film transistor 6 away from the first base substrate 11. Alternatively, the common electrode 7 may be formed on the counter substrate as long as the common electrode 7 may cooperate with the pixel electrode to drive the liquid crystals to deflect.

In some embodiments, as shown in FIG. 3 and FIG. 4, the thin film transistor 6 includes a first thin film transistor and a second thin film transistor. The first thin film transistor is located in the first pixel region A1, and the second thin film transistor is located in the second pixel region A2. A width-to-length ratio of a channel of the second thin film transistor is larger than a width-to-length ratio of a channel of the first thin film transistor.

When the pixel region is increased, the area of the pixel electrode 5 is increased, and a capacitance value of the capacitor formed between the pixel electrode 5 and the common electrode 7 is increased, which results in slow charging. In order to make the charging efficiency of the first pixel region A1 consistent with the charging efficiency of the second pixel region A2, the width-to-length ratio of the channel of the second thin film transistor in the second pixel region A2 is set to be larger, thereby compensating for the reduced charging rate due to the increase of the capacitance value.

In some embodiments, the width-to-length ratio of the channel of the second thin film transistor ranges from 1.8 to 2.2. For example, when the channel of the second thin film transistor has a width of 10 μm and a length of 5 μm, the width-to-length ratio of the channel of the second thin film transistor is 2.

It should be noted that the width-to-length ratio of the channel of the thin film transistor 6 in the embodiment of the present disclosure refers to a width-to-length ratio of a channel portion located in the active layer 62 of the thin film transistor 6. When a voltage signal applied to the gate electrode 61 of the thin film transistor 6 reaches a predetermined value, a carrier path is formed in the channel portion, so that the second electrode 63 of the thin film transistor 6 gets through/electrically connected to the first electrode 64 thereof. The length direction of the channel portion reflects a probability of the carriers being trapped by a gap state in an interface during the migration process. The longer the channel is, the higher the probability of the carriers being captured is. The width direction of the channel portion reflects the probability that the carrier is not captured by the gap state in the interface during the migration process. The wider the channel is, the higher the probability that the carrier is not captured is. Therefore, the higher the width-to-length ratio of the channel is, the easier the carriers drift, and the lower the threshold voltage is.

Figure 5:
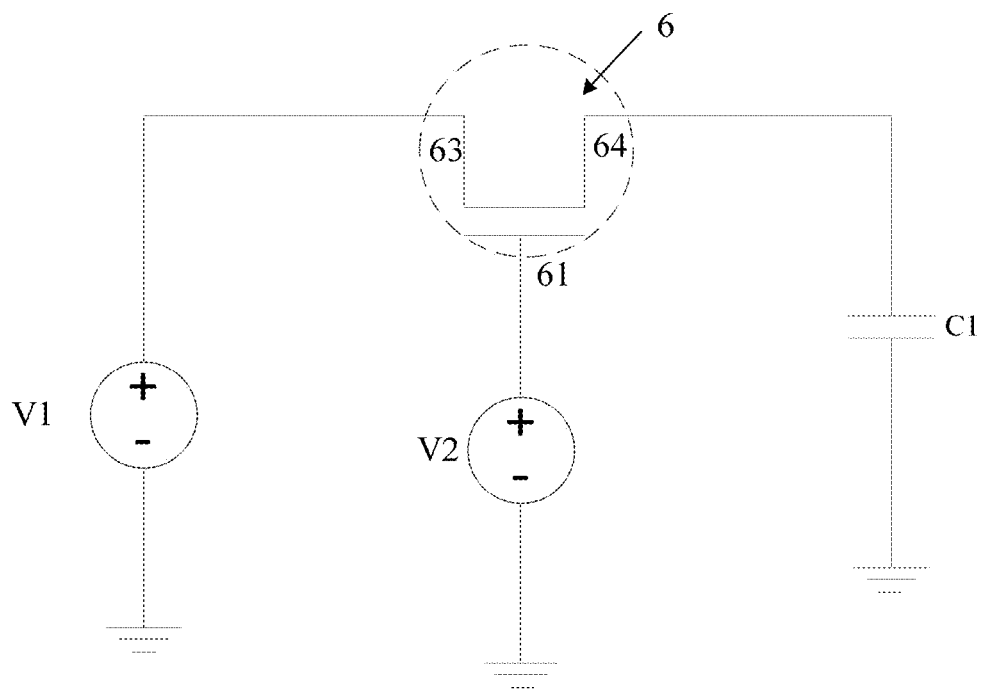
FIG. 5 is a simulation circuit diagram according to an embodiment of the present disclosure.

FIG. 5 is a simulation circuit diagram according to an embodiment of the present disclosure. In some embodiments, as shown in FIG. 5, electrical signals on the first signal line 41 and the second signal line 42 are respectively simulated through voltage pulse signals. The first signal line 41 is a data line and the second signal line 42 is a gate line, that is, a data signal on the data line and a scan signal on the gate line are simulated. The first voltage terminal V1 is connected to the second electrode 63 of the thin film transistor, and the signal provided by the first voltage terminal V1 is equivalent to the data signal on the data line. The signal provided by the second voltage terminal V2 is equivalent to the scan signal on the gate line, and the second voltage terminal V2 is connected to the gate electrode 61 of the thin film transistor. The first electrode 64 of the thin film transistor is connected to the storage capacitor C1, and the storage capacitor C1 is equivalent to the capacitor formed by the pixel electrode and the common electrode. When the signal provided by the second voltage terminal V2 is at an active voltage level, the thin film transistor 6 is turned on, and the voltage signal provided by the first voltage terminal V1 is transmitted to the pixel electrode 5 through the thin film transistor, thereby charging the storage capacitor C1. In the present disclosure, the thin film transistor is an N-type thin film transistor for example, and in this case the active voltage level is a high level. Alternatively, the thin film transistor may be a P-type thin film transistor, and in this case the active voltage level is a low level.

Figure 6A:
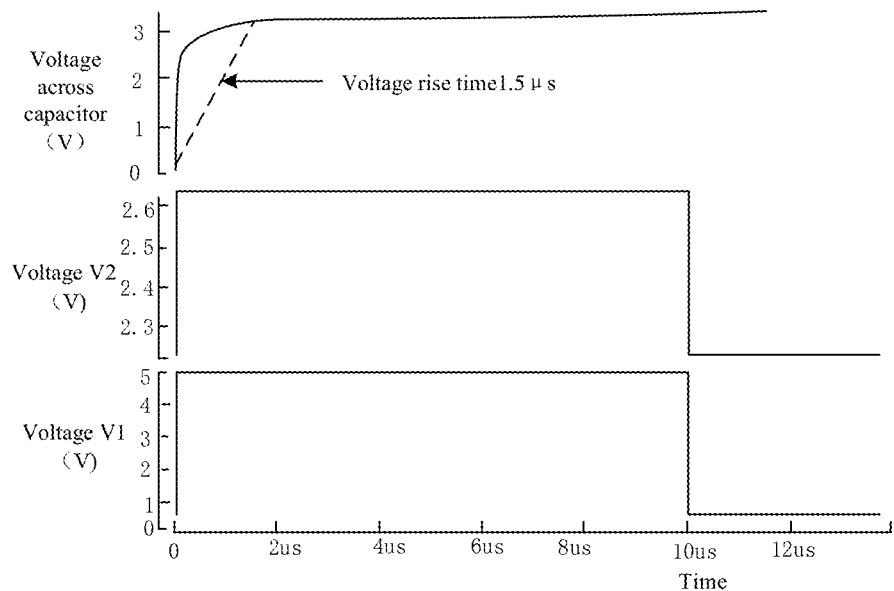
FIG. 6A is a timing chart of a simulation circuit diagram when a channel of a thin film transistor has a width-to-length ratio of 1 and a storage capacitor has a capacitance value of 1 pF.
Figure 6B:
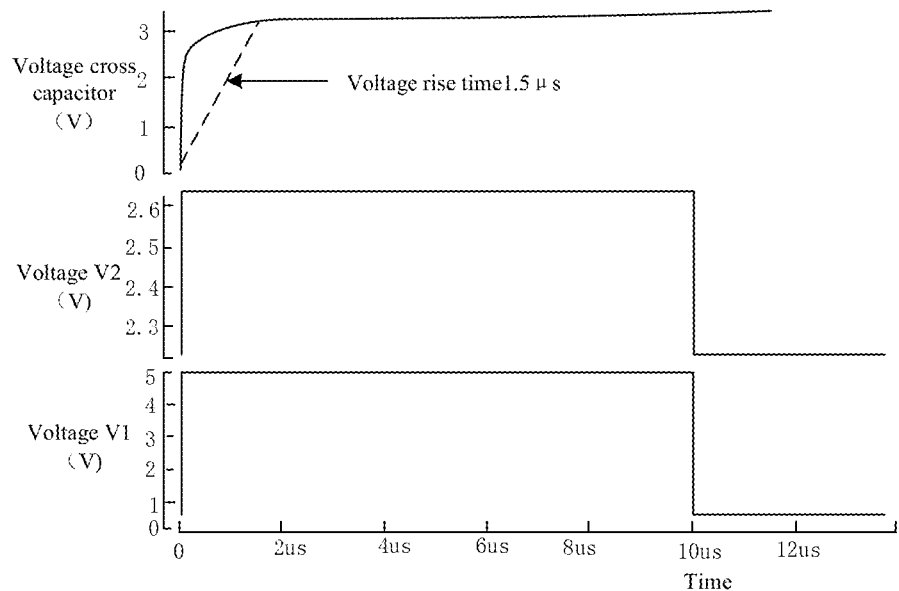
FIG. 6B is a timing chart of a simulation circuit diagram when a channel of a thin film transistor has a width-to-length ratio of 2 and a storage capacitor has a capacitance value of 1.5 pF.

FIG. 6A is a timing diagram of a simulation circuit diagram when the width-to-length ratio of the channel of the thin film transistor is 1 and the capacitance value of the storage capacitor is 1 pF. As shown in FIG. 6A, when the width of the thin film transistor 6 is 5 μm, the length of the thin film transistor is 5 μm (i.e. the width-to-length ratio of the channel of the thin film transistor is 1), and the capacitance value of the storage capacitor C1 is 1 pF, if the signal from the first voltage terminal V1 has a high level, the thin film transistor 6 is turned on, so that the storage capacitor C1 starts to be charged, and the voltage rise time of the storage capacitor C1 (i.e., a time required for the voltage across the storage capacitor C1 to rise to a fixed value) is approximately 1.5 μs. FIG. 6B is a timing diagram of an emulation circuit diagram when the width-to-length ratio of the channel of the thin film transistor is 2 and the capacitance value of the storage capacitor is 1.5 pF. As shown in FIG. 6B, when the width of the thin film transistor 6 is 10 μm, the length of the thin film transistor 6 is 5 μm (i.e. the width-to-length ratio of the channel of the thin film transistor is 2), and the capacitance value of the storage capacitor C1 is 1.5 pF, if the signal from the first voltage terminal V1 has at a high level, the thin film transistor 6 is turned on, so that the storage capacitor C1 starts to be charged, and the voltage rise time of the storage capacitor C1 is approximately 1.5 μs.

In some embodiments, the width-to-length ratio of the channel of the first thin film transistor ranges from 0.8 to 1.2, and the ratio of the width-to-length ratio of the channel of the second thin film transistor to the width-to-length ratio of the channel of the first thin film transistor ranges from 1.5 to 2.75, so as to ensure that the luminous brightness of the first pixel area A1 is consistent with that of the second pixel area A2.

In an embodiment of the present disclosure, when a ratio of the area of the second pixel region A2 to the area of the first pixel region A1 is 1.5 (in this case, a ratio of the capacitance value of the storage capacitor in the second pixel region A2 to the capacitance value of the storage capacitor in the first pixel region A1 is about 1.5), the width-to-length ratio of the channel of the second thin film transistor in the second pixel region A2 is set to 1.5, and the width-to-length ratio of the channel of the first thin film transistor in the first pixel region A1 is set to 1, so that the voltage rise time used for charging the storage capacitor in the first pixel region A1 is consistent with the voltage rise time used for charging the storage capacitor in the second pixel region A2, thereby ensuring the luminance balance between two pixel regions with different sizes, and improving the display uniformity of the display panel.

In some embodiments, the display panel includes a plurality of pairs of bending portions 4b. As shown in FIG. 2, two bending portions 4b in a same pair of bending portions are respectively located in two adjacent second signal lines 42. A target redundant region is between the two bending portions 4b in the same pair of bending portions, and each of the two bending portions 4b in the same pair of bending portions protrudes toward the target redundant region.

It should be noted that a pair of bending portions 4b refers to two bending portions 4b protruding along opposite directions and located on two sides of the same redundant region A3, respectively.

Figure 7A:
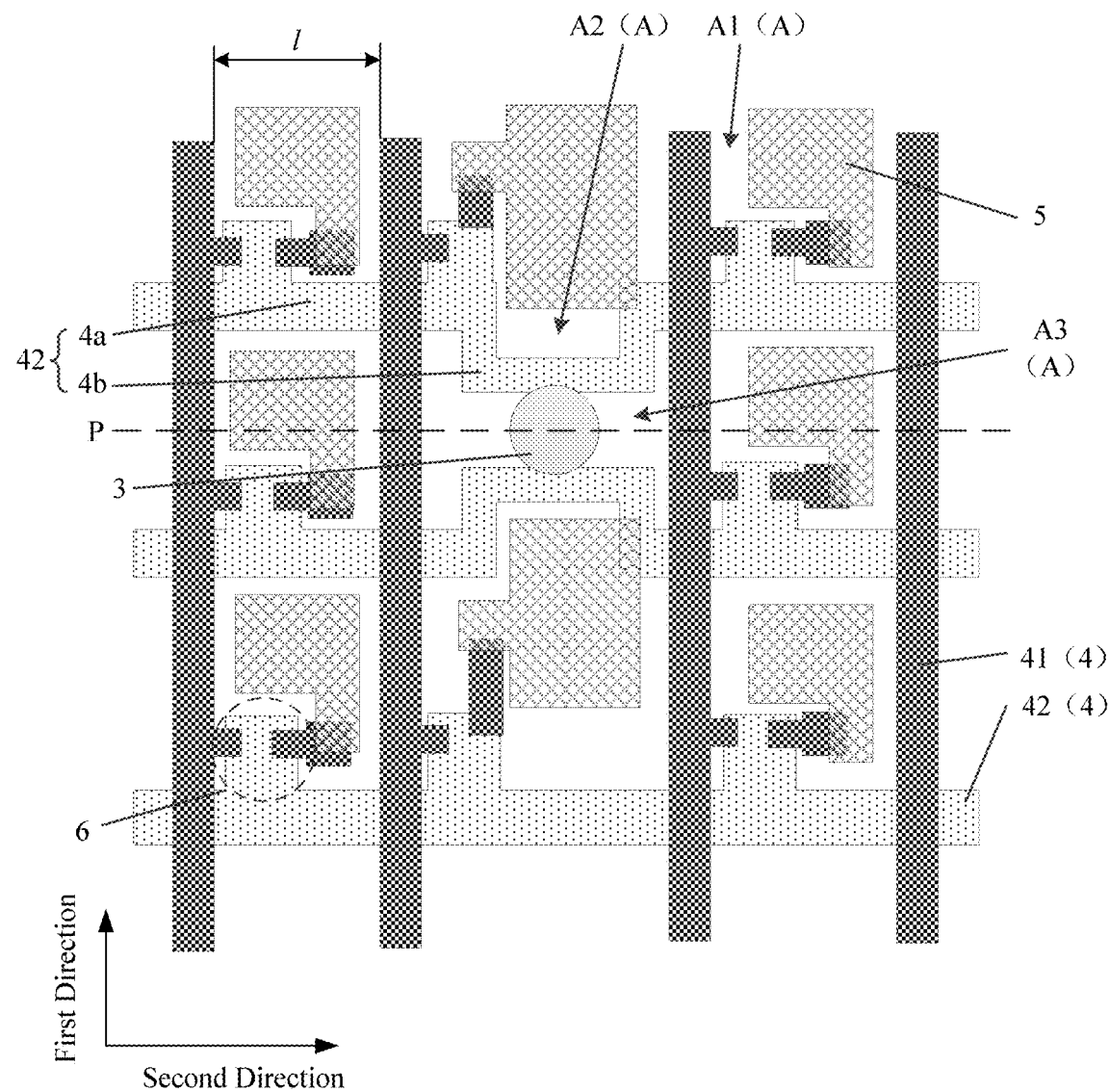
FIG. 7A is a schematic plan view of an array substrate and spacers according to another embodiment of the present disclosure.

FIG. 7A is a schematic plan view of an array substrate and spacers according to another embodiment of the present disclosure. The array substrate and spacers shown in FIG. 7A have a similar structures to those in FIG. 2, that is, the array substrate also have a first pixel region A1, a second pixel region A2 and a redundant region A3, and an orthographic projection of the spacer 3 on the first base substrate 11 at least partially overlaps an orthographic projection of the redundant region A3 on the first base substrate 11, the array substrate and spacers shown in FIG. 7A are different from that in FIG. 2 in that the first signal line 41 extending along the first direction is the data line; the second signal line 42 is a gate line and includes a body portion 4a extending along the second direction, and at least one gate line further includes a bending portion 4b connected to the body portion 4a. The second pixel region A2 and the redundant region A3 are located at two sides of the bending portion 4b, respectively, and the bending portion 4b protrudes toward the redundant region A3.

In some embodiments, as shown in FIG. 2 and FIG. 7A, each of the first pixel regions A1 in the display panel is a rectangular region, and a length of a short side of the rectangular region ranges from 4.2 μm to 17 μm.

It should be noted that the structures of the signal line 4 having the bending portion 4b and the redundant region A3 in the embodiments of the present disclosure are particularly suitable for display panels with a high PPI, wherein the display panels with a high PPI may refer to the display panels having a PPI greater than 500. As shown in FIG. 2 and FIG. 7A, the first pixel region A1 is a rectangular region having a long side extending in the row direction and a short side extending in the column direction. In an example, the PPI of the display panel is 500, and in this case, the length l of the short side of the first pixel region A1 is about 17 μm. When the PPI of the display panel is 1000, the length l of the short side of the first pixel region A1 is about 5.6 μm. When the PPI of the display panel is 2000, the length l of the short side of the first pixel region A1 is about 4.2 μm. The length l of the short side of the first pixel region A1 in the above example may alternatively have other sizes, which is not limited in the embodiment of the present disclosure.

In the embodiment of the present disclosure, no matter how the PPI of the display panel is set, as long as it is ensured that the orthographic projection of the spacer 3 on the first base substrate 11 does not overlap the orthographic projections of each of the first pixel region A1 and the second pixel region A2 on the first base substrate 11, the spacer 3 may be prevented from affecting the aperture ratio of the display panel, and the positional relationship between the spacer 3 and the bending portion 4b is not particularly limited by the present disclosure. For example, the orthographic projection of the spacer 3 on the first base substrate 11 may partially overlap the orthographic projection of the bending portion 4b on the first base substrate 11, or the orthographic projection of the spacer 3 on the first base substrate 11 may not overlap at all the orthographic projection of the bending portion 4b on the first base substrate 11. In an example, as shown in FIG. 2 and FIG. 7A, the orthographic projection of the spacer 3 on the first base substrate 11 at least partially overlaps the orthographic projection of the bending portion 4b on the first base substrate 11, so that an area of an orthographic projection of the spacer 3 on the first base substrate 11 can be increased, and the supporting capability of the spacer 3 can be further improved.

In some embodiments, the display panel includes a plurality of second pixel regions A2 and the plurality of second pixel regions A2 have the same area, thereby facilitating calculation of a driving signal for each of the second pixel regions A2 according to image information during displaying of an image.

When the display panel includes the plurality of second pixel regions A2, the channels of the plurality of second thin film transistors may have the same width-to-length ratio, and the plurality of second thin film transistors may be in one-to-one correspondence to the plurality of second pixel regions A2.

In some embodiments, as shown in FIG. 2 and FIG. 7A, two bending portions 4b in the same pair of bending portions have mirror symmetry about a symmetry axis P extending in the second direction, so as to facilitate manufacturing of the display panel.

In some embodiments, as shown in FIG. 2, the first pixel electrode 51 and the second pixel electrode 52 have different shapes from each other, and the first pixel electrode 51 and the second pixel electrode 52 are the pixel electrodes in the second pixel regions A2 adjacent to the two bending portions 4b in the same pair of bending portions, respectively.

Specifically, in FIG. 2, the second data line 42 extending along the second direction is on the left side of the first pixel electrode 51, and the bending portion 4b is on the right side of the first pixel electrode 51. The first pixel electrode 51 has a main body portion and a connection portion connected to the thin film transistor, and the position where the connection portion is connected to the main body portion is in the middle of the main body portion. The bending portion 4b is on the left side of the second pixel electrode 52, and the second data line 42 extending in the second direction is on the right side of the second pixel electrode 52. The second pixel electrode 52 has a main body portion and a connection portion connected to the thin film transistor, and the position where the connection portion is connected to the main body portion is proximal to the second data line 42 on the right side of the second pixel electrode 52. That is, the position of the connection portion of the first pixel electrode 51 is different from the position of the connection portion of the second pixel electrode 52, resulting in different shapes of the first pixel electrode 51 and the second pixel electrode 52.

In addition, the shapes of the first pixel electrode 51 and second pixel electrode 52 may be different from the shape of the pixel electrode 5 in the first pixel region A1. For example, the pixel electrode 5 in the first pixel region A1 similarly has a main body portion and a connection portion, but the area of the main body portion of the pixel electrode 5 in the first pixel region A1 may be smaller than the area of the main body portion of the second pixel electrode 51 and also smaller than the area of the main body portion of the second pixel electrode 52.

Figure 7B:
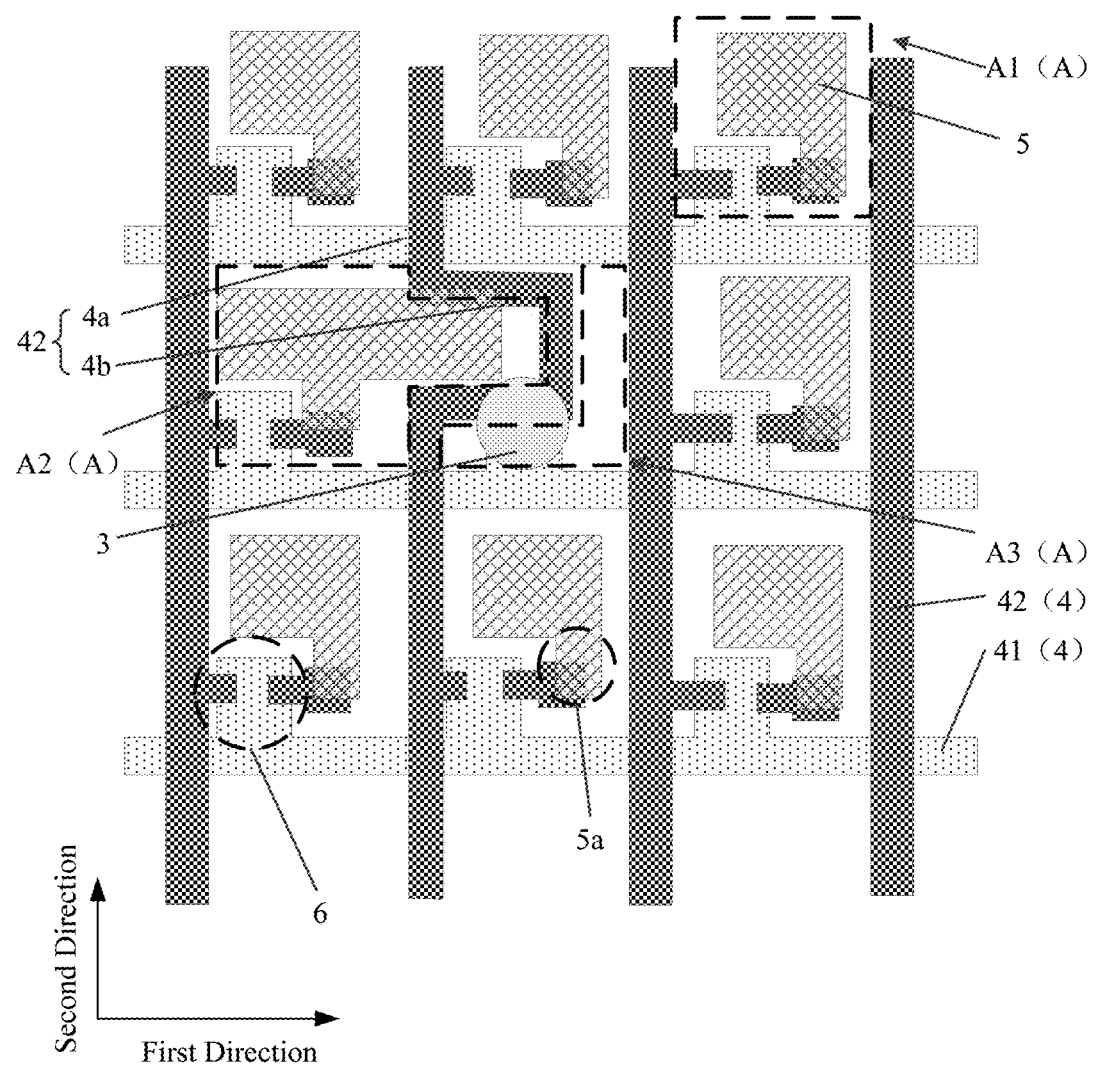
FIG. 7B is a schematic plan view of an array substrate and spacers according to yet another embodiment of the present disclosure.

FIG. 7B is a schematic plan view of an array substrate and spacers according to another embodiment of the present disclosure. In some embodiments, as shown in FIG. 7B, the display panel includes a plurality of bending portions 4B, each of the bending portions 4B is located between two adjacent second signal lines extending along the second direction, and the bending portion 4B protrudes toward the redundant region.

That is, one first pixel region A1 and one second pixel region A2 may be respectively disposed on two sides of the redundant region A3 of the display panel, so that the redundant region is located between the first pixel region A1 and the second pixel region A2, as shown in FIG. 7B. The second pixel region A2 in the display panel may be made large enough to compensate for the luminance loss in the redundant region A3 due to the missing pixel structure, and to prevent the luminance of the display panel from being reduced.

An embodiment of the present disclosure further provides a display device, which includes the above display panel, and the display panel is a liquid crystal display panel, and the display device further includes a backlight module and a driving circuit.

The display device may display through a field sequential method. Specifically, the backlight module is configured to provide light in a plurality of primary colors, such as red, green and blue, for the display panel during each display period of the display device. The driving circuit is configured to provide driving signals to the display regions according to image information of sub-images in corresponding primary colors of the target image during sub-phases SP1-SP3 of the display period DP. In an example, each image to be displayed Im can be regarded as superposition of a red sub-image, a green sub-image and a blue sub-image, and when the image is displayed, firstly image information of the red sub- image, image information of the green sub-image and image information of the blue sub- image are determined according to the image information of the image to be displayed; and then, during the first sub-phase SP1 of the display period DP, the backlight module provides red light R, and meanwhile the driving circuit provides driving signals for the pixel regions according to the image information of the red sub-image; during the second sub-phase SP2, the backlight module provides green light G, and meanwhile the driving circuit provides driving signals for the pixel regions according to the image information of the green sub-image; and during the third sub-phase SP3, the backlight module provides blue light B, and the driving circuit provides driving signals for the pixel regions according to the image information of the blue sub-image.

The liquid crystal display panel of the display device in the embodiment of the present disclosure adopts the field sequential method to display. Color display can be realized by using field sequential backlight, so that color film layers are not required to be provided on the counter substrate, thereby improving the light transmissivity of display screen, and reducing the power consumption of field sequential display module assembly, as a result the field sequential display module assembly can better meet the needs of various applications.

Figure 8:
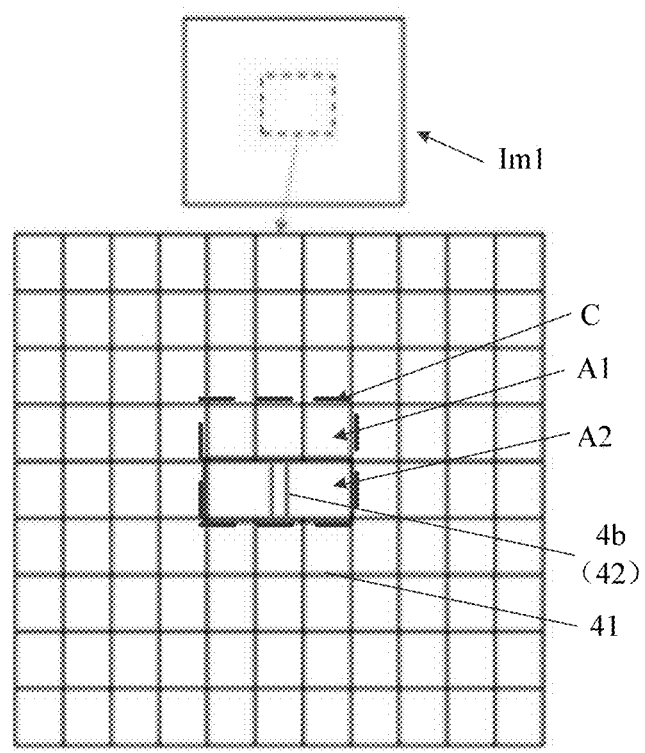
FIG. 8 is a schematic diagram of a sub-image and a distribution of regions in a display panel according to an embodiment of the present disclosure.
Figure 9:
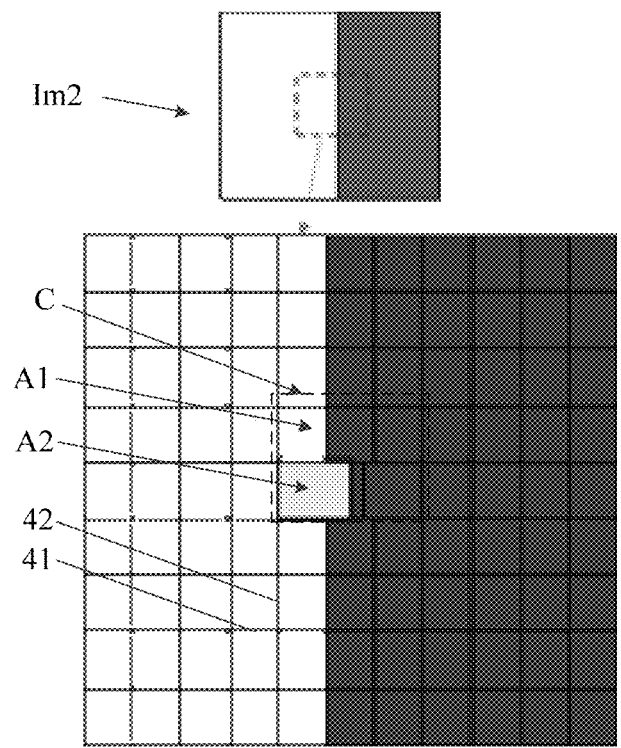
FIG. 9 is a schematic view of a sub-image and a distribution of regions in the display panel according to another embodiment of the present disclosure.

In addition, when the display panel of the display device adopts the structure of the array substrate and the spacers shown in FIG. 1 and the counter substrate 2 is provided with the color film layers, if the spacers 3 are formed at the positions corresponding to the blue pixel regions, since the absolute luminance of blue is lower than those of red and green, the effect of the spacers 3 on the luminance of the blue pixel regions is small. If the structure of the array substrate and the spacers shown in FIG. 1 is adopted and the field sequential driving mode is adopted, no matter which pixel region the spacers 3 are formed in, the display effect is negatively affected obviously. However, the display device in the embodiment of the present disclosure adopts the display panel shown in FIGS. 2 to 4 and FIG. 7A and FIG. 7B, which can reduce the phenomenon of poor display regardless of whether the field sequential driving mode is used FIG. 8 is a schematic diagram showing a sub-image and a distribution of regions in a display panel in an embodiment of the present disclosure. FIG. 9 is a schematic view showing a sub-image and a distribution of regions in a display panel in another embodiment of the present disclosure. In some embodiments, as shown in FIG. 8 and FIG. 9, the display panel includes at least one to-be-adjusted region C, each of the to-be-adjusted region C is located between the body portions of the two second signal lines 42 and includes n second pixel regions A2 and m first pixel regions A1, wherein the m first pixel regions A1 are located on a side of the n second pixel regions A2 along the second direction. The to-be-adjusted region C is defined by the body portions of the two second signal lines 42 and the two first signal lines 41.

For example, if a region formed by two second pixel regions A2 adjacent to the same pair of bending portions 4b and a redundant region between the two second pixel regions A2 is referred to as a pixel region set, the to-be-adjusted region C may include one second pixel region set and the smallest region including multiple first pixel regions which are located on a side of the second pixel region set in the second direction and adjacent to the second pixel region set. The display panel may include multiple pairs of bending portions, and correspondingly the display panel may include multiple to-be-adjusted regions.

Each sub-image of the image to be displayed includes a plurality of image pixels, and each first pixel region in the display panel corresponds to a corresponding one of the image pixels, so that when the driving signal is provided for the display panel, the driving signal can be provided to the first pixel region according to the gray scale of the image pixel corresponding to the first pixel region. For the second pixel region, the driving circuit may provide the driving signal to the second pixel region according to the image information of the portion of the sub-image corresponding to the to-be-adjusted region C. Specifically, the following two driving methods will be illustrated.

According to the first method, as shown in FIG. 8, a portion of the sub-image Im1 corresponding to to-be-adjusted region C displays a picture with uniform gray scales. In this case, the driving signals provided by the driving circuit for each of the first pixel region and the second pixel region in to-be-adjusted region C satisfy that after the first and second pixel regions emit light, the sum of the luminous fluxes of the n second pixel regions A2 is substantially equal to the sum of the luminous fluxes of the m first pixel regions A1. The term "substantially equal to" means that the difference between the two values is not more than 5%, 10% or 15%. Alternatively, the two values may be completely equal to each other.

In an example, as shown in FIG. 8, the to-be-adjusted region C includes two second pixel regions A2, the redundant region A3 between the two second pixel regions A2, and three first pixel regions A1 on a side of the two second pixel regions A2 in the second direction, wherein a ratio of an area of the second pixel region A2 to an area of the first pixel region A1 is 1.5. The portion of the sub-image Im1 corresponding to the to-be-adjusted region C displays a picture with uniform gray scales and includes image pixels arranged in two rows and three columns. The three image pixels in the first row are in one-to-one correspondence to the three first pixel regions A1 in the to-be-adjusted region C. Assuming that the driving signals, determined according to the three image pixels in the first row, for the three first pixel regions A1 in the to-be-adjusted region C each are v1 and the luminous fluxes of the three first pixel regions A1 after being driven each are 200 cd, the driving signals for the two second pixel regions A2 in the to-be-adjusted region C may be determined according to the driving signals v1, so that the luminous fluxes of the two second pixel regions A2 each are 300 cd. In this case, the sum of the luminous fluxes of the two second pixel regions A2 is 600 cd, and the sum of the luminous fluxes of the three first pixel regions A1 is 600 cd too, therefore the two second pixel regions A2 can compensate for the luminance loss of the redundant region A3 located between the two second pixel regions A2, so that no significant shading change occurs in the display panel.

The above-mentioned luminous flux can be calculated according to formula 1:

$$\Phi = \text{gray} \cdot S \quad (1)$$

Where $\Phi$ represents luminous flux in cd, gray represents gray-scale luminance in nit, and s represents an area in $m^2$.

It should be noted that the portion of the sub-image Im1 corresponding to the to-be-adjusted region C displaying a picture with uniform gray scales means that the image pixels of the sub-pixel Im1 corresponding to the to-be-adjusted region C have similar gray scales, for example, the difference between the gray scales is less than 5, 10 or 15.

According to the second method, as shown in FIG. 9, the portion of the sub-image Im2 corresponding to the to-be-adjusted region C displays a picture with a gray scale jump (gray scales of adjacent pixels changing significantly), and one of the second pixel regions A2 is located at a boundary of the abrupt gray scales (i.e., a line between adjacent pixels with gray scales changing significantly). In this case, the driving signals provided by the driving circuit for each of the first pixel region and the second pixel region in the to-be-adjusted region C satisfy that after the first pixel region A1 and second pixel region A2 emit light, the target luminance of the first target pixel region is the product of the target luminance of the second pixel region located on the boundary and a first ratio, so that the luminous flux of the second pixel region A2 located on the boundary is equal to the luminous flux of the first target pixel region, thereby preventing a difference of luminance from occurring between two sides of the boundary. The first target pixel region is one of the first pixel regions A1 in the to-be-adjusted region C. The two second signal lines 42 adjacent to the first target pixel region are the same as the two second signal lines 42 adjacent to the second pixel region A2 on the boundary of the gray scale jump. The first ratio is a ratio of an area of the second pixel region A2 to an area of the first pixel region A1.

In an example, as shown in FIG. 9, the ratio of the area of the second pixel region A2 to the area of the first target pixel region A1 is 1.5. The portion of the sub-image Im2 corresponding to the to-be-adjusted region C displays a picture with a gray scale jump. It is assumed that the driving signal for the first target pixel region A1 is v3, the luminous flux of the first target pixel region A1 after being driven is 200 cd, the driving signal for the second pixel region A2 is v4, and the luminous flux of the second pixel region A2 after being driven is 200 cd, which is equal to the luminous flux of the first target pixel region A1 after being driven. According to above equation 1, a ratio of the target luminance of the first pixel region A1 to the target luminance of the second pixel region A2 is 1.5, which is equal to a ratio of the area of the second pixel region A2 to the area of the first pixel region A1. For example, the target luminance for the first pixel region A1 is 200 nit, and the target luminance for the second pixel region A2 is 133 nit. Although the area of the second pixel region A2 is larger than the area of the first pixel region A1, the target luminance of the second pixel region A2 is lower than the target luminance of the first pixel region A1, therefore the luminous flux of the second pixel region A2 is substantially equal to the luminous flux of the first pixel region A1, and thus no obvious visual defect is caused to the whole display of the display panel.

It should be noted that, the portion of the sub-image Im2 corresponding to the to-be-adjusted region C displaying a picture with the gray scale jump means that a boundary exists in the portion of the sub-image Im2 corresponding to the to-be-adjusted region C, and the difference between the gray scales of the image pixels on two sides of the boundary is large, for example, larger than 100, 150 or 200. For example, as shown in FIG. 9, the to-be-adjusted region C includes image pixels in two rows and three columns. Assuming that the image pixels in the first column on the left have a gray scale of 255 and the image pixels in the remaining two columns have a gray scale of 0, there is a boundary, on which the gray scales changes significantly, between the image pixels in the first column on the left and the image pixels in the middle column, and the second pixel region A2 on the left in the to-be-adjusted region is located on the above-mentioned boundary.

It should be noted that, when the display panel employs the structure as shown in FIG. 7B, a region including the redundant region and the first pixel region A1 and the second pixel region A2 respectively located at two sides of the redundant region can be referred to as a pixel region set. The to-be-adjusted region C may include above pixel region set and the smallest region including multiple first pixel regions which are on a side of the pixel region set along the second direction and adjacent to the pixel region set. The display panel may include multiple pairs of bending portions, and correspondingly the display panel may include multiple to-be-adjusted regions. That is, the display panel employing the structure shown in FIG. 7B is also suitable for the above driving method of the driving circuit, so as to provide the driving signal for the second pixel region, thereby reducing the phenomenon of poor display.

An embodiment of the present disclosure further provides a method for manufacturing the array substrate 1 in FIG. 3. FIG. 10A to FIG. 10E are schematic diagrams showing steps of the method for manufacturing the array substrate 1. As shown in FIG. 3 and FIG. 10A to FIG. 10E, the method includes steps S11 to S15.

Figure 10A:
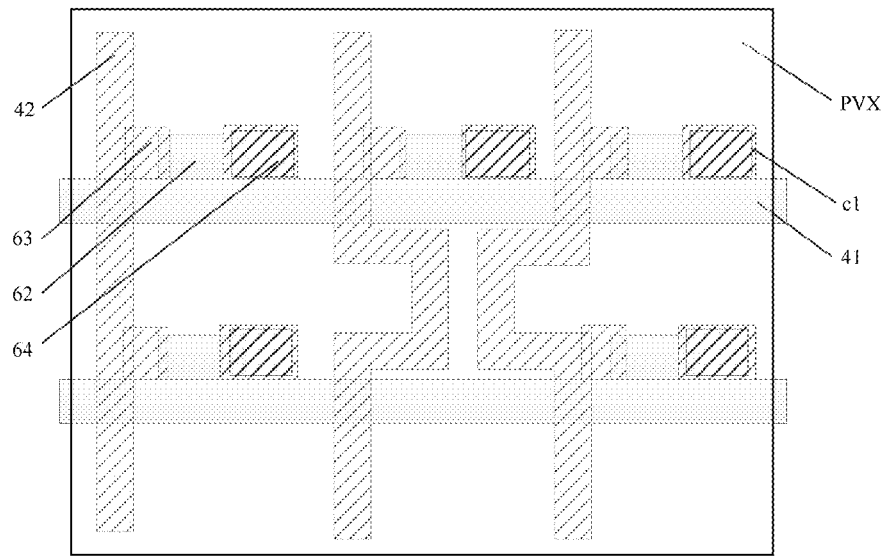
FIG. 10A to FIG. 10E are schematic views showing a process for manufacturing an array substrate according to an embodiment of the present disclosure.

At step S11, as shown in FIG. 10A, a first base substrate 11 is provided; and a gate electrode 61 of the thin film transistor 6, a gate insulating layer GI, an active layer 62 of the thin film transistor 6, a second electrode 63 and a first electrode 64 of the thin film transistor 6, and a passivation layer PVX are sequentially formed on the first base substrate 11. The second electrode 63 and the first electrode 64 of the thin film transistor 6 are each connected to the active layer 62, and a first via hole c1 exposing the first electrode 64 is formed in the passivation layer PVX.

The material of the gate insulating layer GI includes any one of silicon oxynitride, silicon oxide, silicon nitride, silicon oxycarbide, silicon carbonitride, aluminum oxide, aluminum nitride, tantalum oxide, hafnium oxide, zirconium oxide, titanium oxide, and the like. The material of the gate electrode 61 includes any one of, metal, metal alloy, metal nitride, conductive metal oxide, transparent conductive material, and the like for example. In addition, each of the gate insulating layer GI and the gate electrode 61 may be a single layer or a multilayer.

Figure 10B:
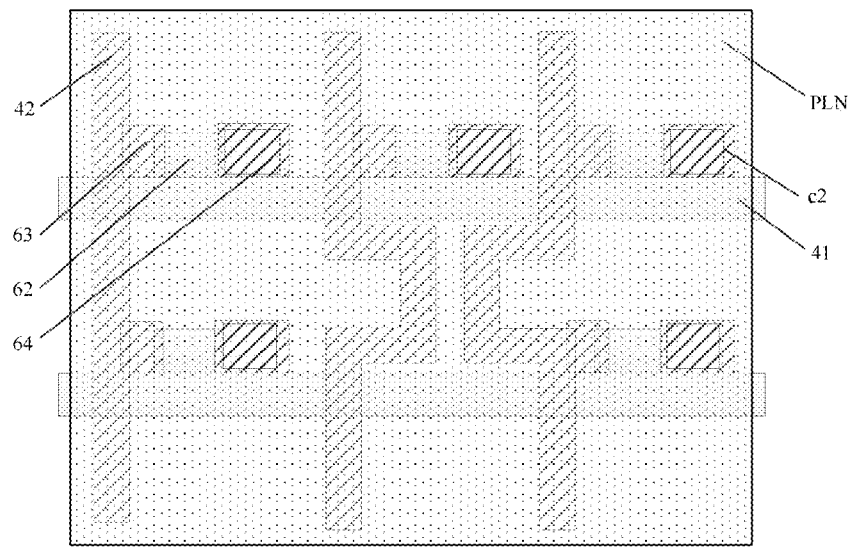

At step S12, as shown in FIG. 10B, a planarization layer PLN is formed on the passivation layer PVX, and a second via hole c2 exposing the first electrode 64 is formed in the planarization layer PLN. The planarization layer PLN may be made of an organic insulating material, for example resin materials such as polyimide, epoxy, acryl, polyester, photoresist, polyacrylate, polyamide, and siloxane.

Figure 10C:
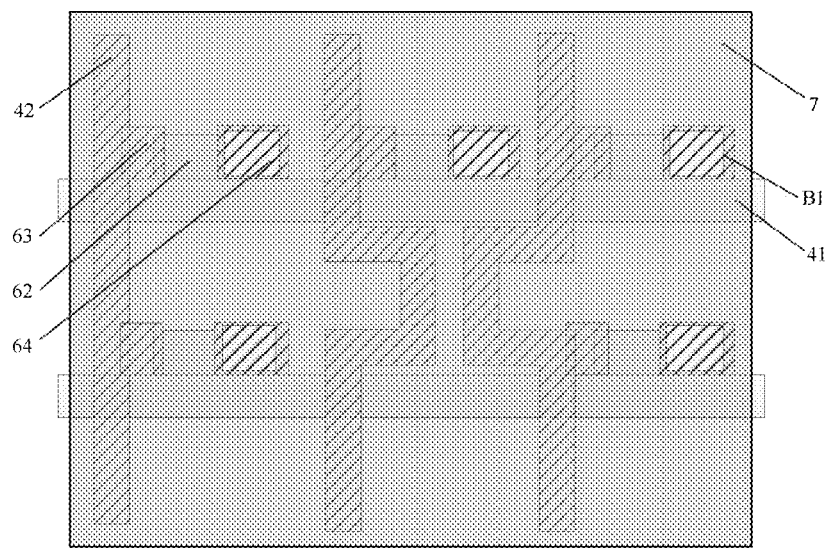

At step S13, as shown in FIG. 10C, the common electrode 7 is formed on the planarization layer PLN, and the common electrode 7 has a first hollow portion B1 exposing the first electrode 64.

Figure 10D:
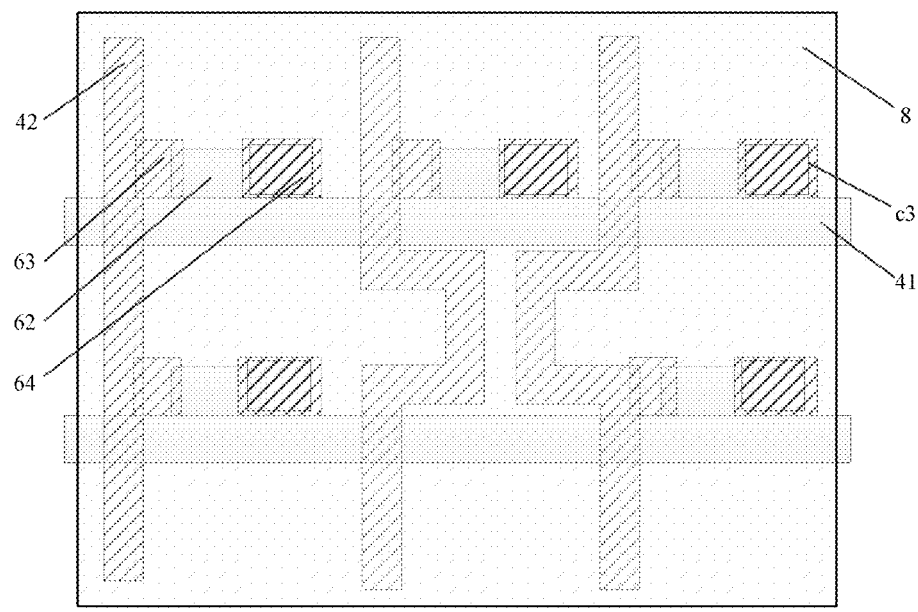

At step S14, as shown in FIG. 10D, an insulating layer 8 is formed on the common electrode 7, and a third via hole c3 exposing the first electrode 64 is formed in the insulating layer 8.

Figure 10E:
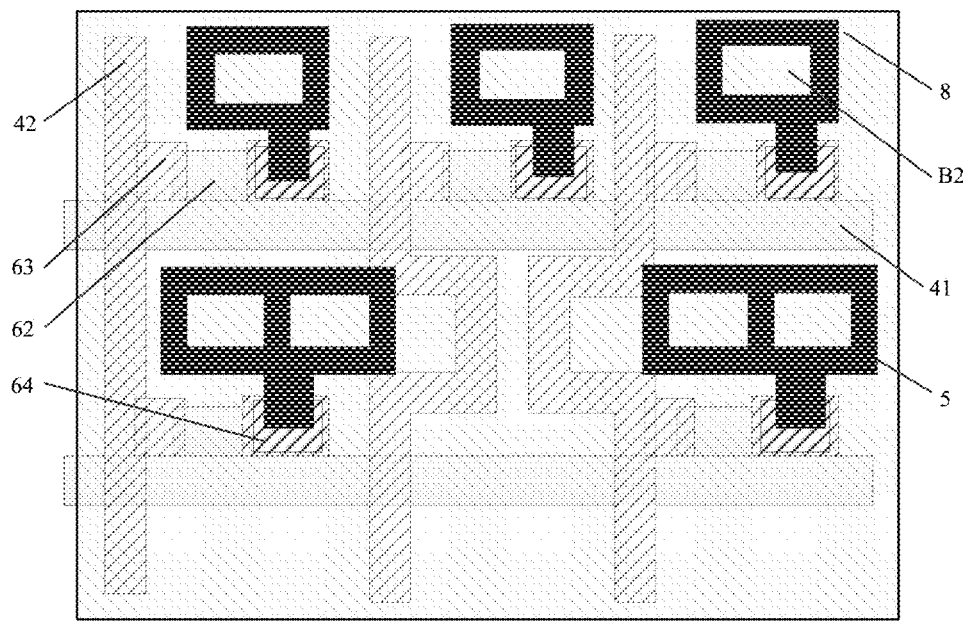

At step S15, as shown in FIG. 10E, the pixel electrode 5 is formed on the insulating layer 8, and the pixel electrode 5 is connected to the first electrode 64 of the thin film transistor 6 through the via hole (i.e., the combination of the first via hole c1, the second via hole c2, and the third via hole c3) penetrating the insulating layer 8, the common electrode 7, the planarization layer PLN, and the passivation layer PVX. The pixel electrode 5 has a second hollow portion B2, and an orthographic projection of the second hollow portion B2 on the first base substrate 11 overlaps an orthographic projection of the common electrode 7 on the first base substrate 11.

It should be noted that all of the orthographic projections of the first via hole c1, the first hollow portion B1, the second via hole c2 and the third via hole c3 on the first base substrate 11 are within the orthographic projection of the first hollow portion B1 on the first base substrate 11, so that the pixel electrode 5 is prevented from being short-circuited with the common electrode 7.

An embodiment of the present disclosure further provides another method for manufacturing the array substrate 1 in FIG. 4. FIG. 11A to FIG. 11E are schematic diagrams showing steps of the method for manufacturing the array substrate 1. Referring to FIG. 4 and FIG. 11A to FIG. 11E, the method includes steps S21 to S25.

Figure 11A:
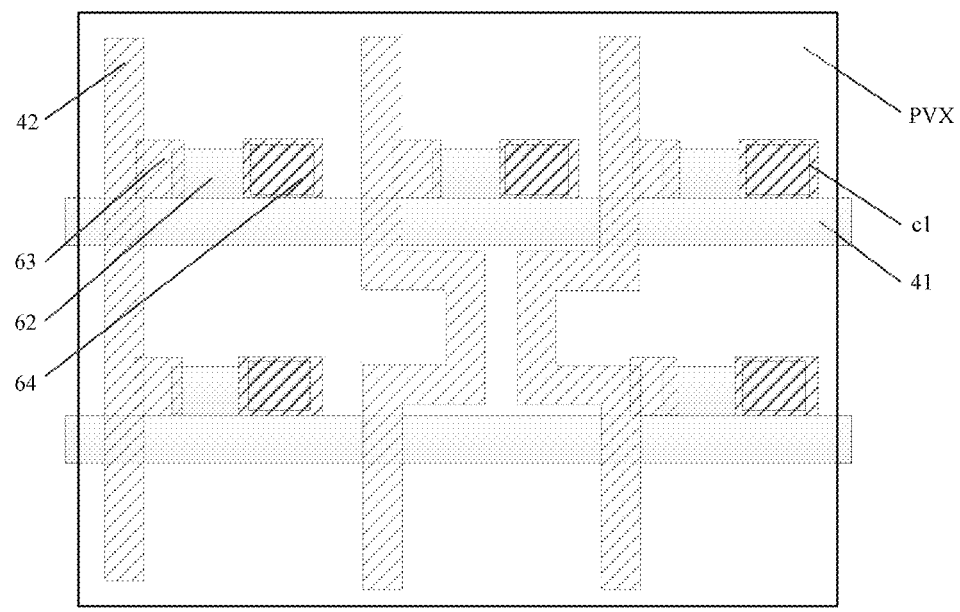
FIG. 11A to FIG. 11E are schematic views showing a process for manufacturing an array substrate according to another embodiment of the present disclosure.

At step S21, as shown in FIG. 11A, a first base substrate 11 is provided, and a gate electrode 61 of the thin film transistor 6, a gate insulating layer GI, an active layer 62 of the thin film transistor 6, a second electrode 63 and a first electrode 64 of the thin film transistor 6, and a passivation layer PVX are sequentially formed on the first base substrate 11. The second electrode 63 and the first electrode 64 of the thin film transistor 6 are each connected to the active layer 62, and a first via hole c1 exposing the first electrode 64 is formed in the passivation layer PVX.

Figure 11B:
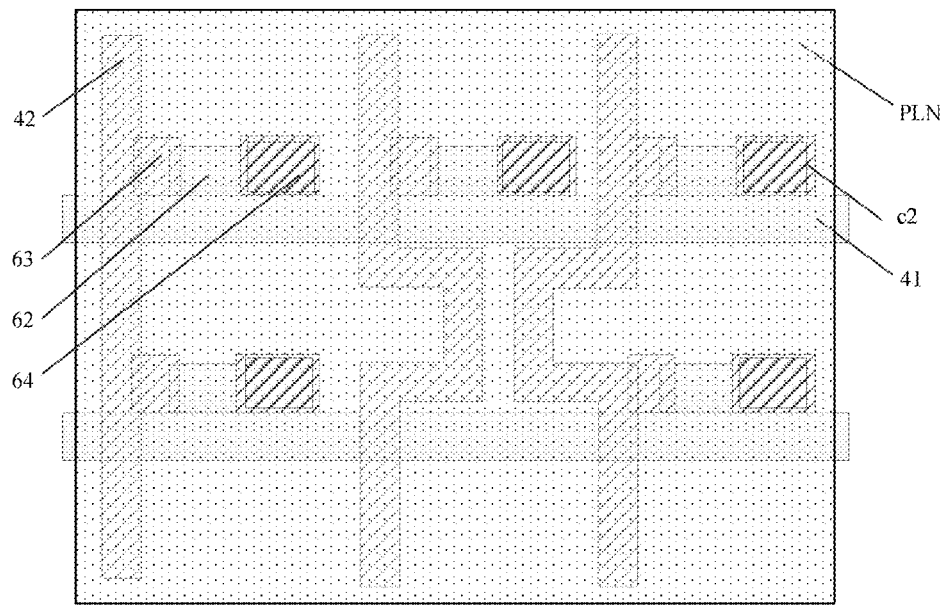

At step S22, as shown in FIG. 11B, a planarization layer PLN is formed on the passivation layer PVX, and a second via hole c2 exposing the first electrode 64 is formed in the planarization layer PLN.

Figure 11C:
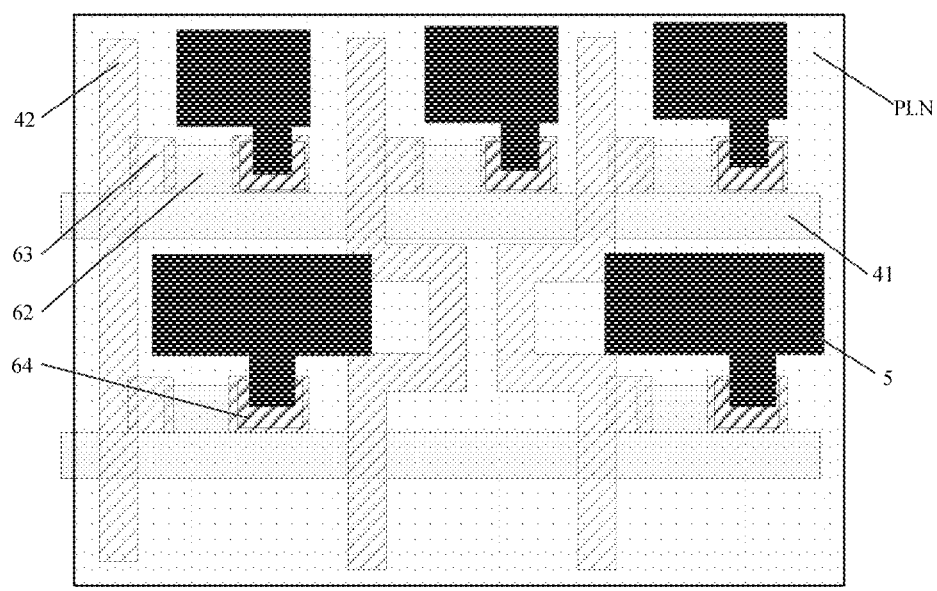

At step S23, as shown in FIG. 11C, the pixel electrode 5 is formed on the planarization layer PLN, and the pixel electrode 5 is connected to the first electrode 64 of the thin film transistor 6 through the via hole (i.e., the combination of the first via hole c1, the second via hole c2) penetrating the planarization layer PLN and the passivation layer PVX.

Figure 11D:
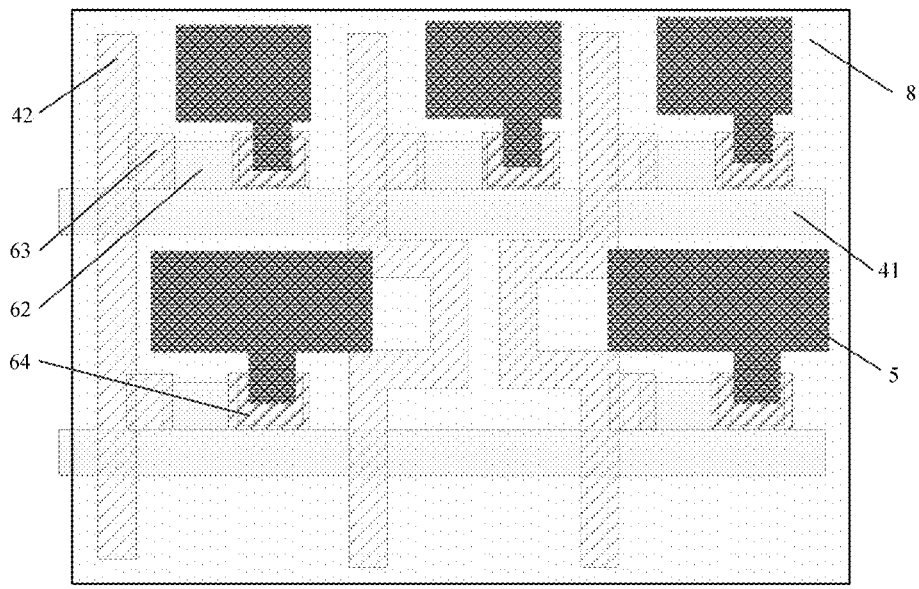

At step S24, as shown in FIG. 11D, the insulating layer 8 is formed on the pixel electrode 5.

Figure 11E:
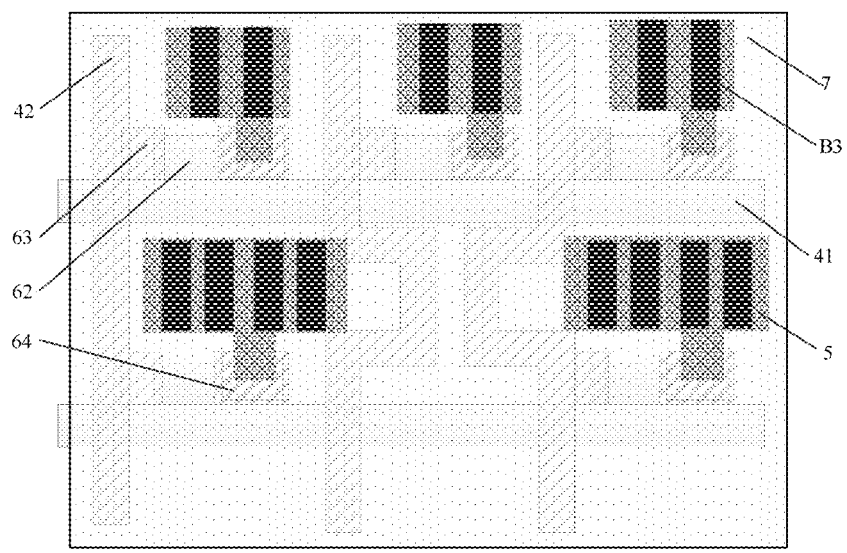
Figure 12:
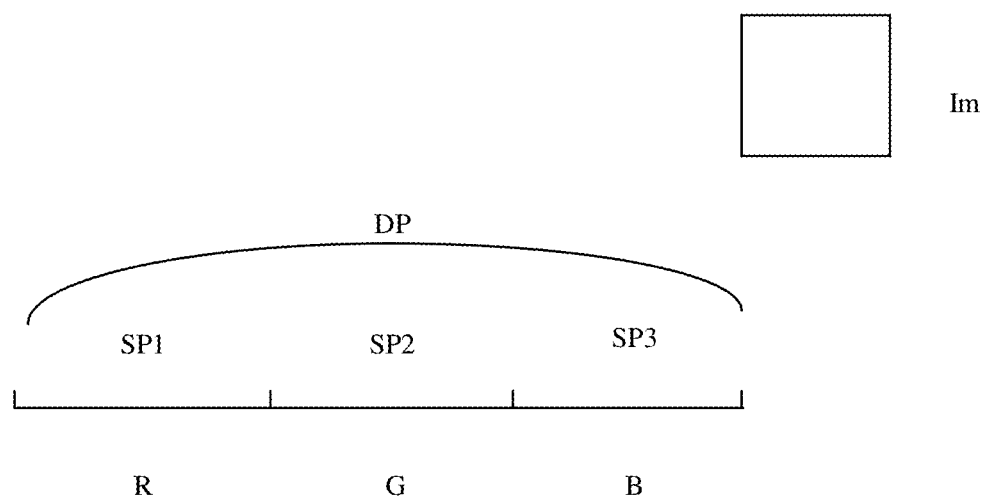
FIG. 12 is a schematic view of sub-phases of a display period according to an embodiment of the present disclosure.

At step S25, as shown in FIG. 11E, the common electrode 7 is formed on the insulating layer 8. The common electrode 7 has a third hollow portion B3, and an orthographic projection of the third hollow portion B3 on the base substrate overlaps an orthographic projection of the pixel electrode 5 on the base substrate. For example, the orthographic projection of each pixel electrode 5 on the base substrate overlaps the orthographic projections of a plurality of third hollows B3 on the base substrate.

An embodiment of the present disclosure provides a virtual reality device, which includes above display device.

In the display device in the embodiment of the present disclosure, the spacer 3 is disposed in the redundant region A3, and the redundant region A3 has no display effect, so that the display effect of the display panel cannot be affected. Meanwhile, by increasing the area of the second pixel region A2, the loss of brightness in the redundant region A3 caused by the missing pixel structure can be compensated, and the defects of the display panel can be prevented. Therefore, when the virtual reality device adopting the display device can have high resolution, and ensure the support effect of the spacers 3 without shielding the effective pixel region.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and essence of the present disclosure, and these changes and modifications are to be considered within the scope of the present disclosure.

What is claimed is:

1. A display panel, comprising an array substrate, a counter substrate and a spacer between the array substrate and the counter substrate; wherein
   the array substrate comprises a base substrate and a plurality of signal lines on the base substrate, the plurality of signal lines comprise a plurality of first signal lines and a plurality of second signal lines, the plurality of first signal lines and the plurality of second signal lines intersect each other to define a plurality of first regions, and the plurality of first regions comprise a first pixel region, a second pixel region and a redundant region, each of the plurality of first signal lines extends along a first direction, each of the plurality of second signal lines comprises a body portion extending along a second direction, at least one of the plurality of second signal lines further comprises a bending portion connected to the body portion, and the first direction intersecting the second direction, the first pixel region is adjacent to the body portion of the at least one second signal line, the second pixel region and the redundant region are on two sides of the bending portion along the first direction, respectively, and the bending portion protrudes towards the redundant region, an area of an orthographic projection of the second pixel region on the base substrate is larger than an area of an orthographic projection of the first pixel region on the base substrate, and the area of the orthographic projection of the first pixel region on the base substrate is larger than an area of an orthographic projection of the redundant region on the base substrate, and an orthographic projection of the spacer on the base substrate at least partially overlaps the orthographic projection of the redundant region on the base substrate, an orthographic projection of the bending portion of the second signal line on the base substrate overlaps the orthographic projection of the spacer on the base substrate and does not overlap an orthographic projection of the first signal line on the base substrate.

2. The display panel of claim 1, wherein a ratio of the area of the orthographic projection of the second pixel region on the base substrate to the area of the orthographic projection of the first pixel region on the base substrate ranges from 1.5 to 1.9.

3. The display panel of claim 1, wherein the array substrate further comprises a plurality of pixel electrodes and a plurality of thin film transistors, each of the first pixel region and the second pixel region is provided therein with a corresponding one of the plurality of pixel electrodes and a corresponding one of the plurality of thin film transistors, the pixel electrode is located on a side of the thin film transistor away from the base substrate and is connected to a first electrode of the thin film transistor, and one of a gate electrode and a second electrode of the thin film transistor is connected to the first signal line, and the other of the gate electrode and the second electrode of the thin film transistor is connected to the second signal line, and the orthographic projection of the redundant region on the base substrate does not overlap an orthographic projection of the pixel electrode on the base substrate.

4. The display panel of claim 3, wherein the array substrate further comprises a common electrode, the common electrode is on a side of the pixel electrode proximal to the thin film transistor, the common electrode comprises a first hollow portion, and the pixel electrode is connected to the first electrode of the thin film transistor through the first hollow portion of the common electrode, and the pixel electrode comprises a second hollow portion, and an orthographic projection of the second hollow portion on the base substrate overlaps an orthographic projection of the common electrode on the base substrate.

5. The display panel of claim 3, wherein the array substrate further comprises a common electrode, the common electrode is on a side of the pixel electrode away from the thin film transistor, and the common electrode comprises a third hollow portion, and an orthographic projection of the pixel electrode on the base substrate overlaps an orthographic projection of the third hollow portion on the base substrate.

6. The display panel of claim 3, wherein the plurality of thin film transistors comprise a first thin film transistor in the first pixel region and a second thin film transistor in the second pixel region, and a width-to-length ratio of a channel of the second thin film transistor is larger than a width-to-length ratio of a channel of the first thin film transistor.

7. The display panel of claim 6, wherein the channel of the second thin film transistor has a width-to-length ratio in a range from 1.8 to 2.2.

8. The display panel of claim 6, wherein a ratio of the width-to-length ratio of the channel of the second thin film transistor to the width-to-length ratio of the channel of the first thin film transistor ranges from 1.8 to 2.75.

9. The display panel of claim 1, wherein one of the first signal line and the second signal line is a data line, and the other of the first signal line and the second signal line is a gate line.

10. The display panel of claim 1, wherein the first pixel region is a rectangular region having a short side of 4.2 μm to 17 μm length.

11. The display panel of claim 1, wherein the display panel comprises a plurality of pairs of bending portions, and two bending portions in a same pair of bending portions are respectively in two adjacent second signal lines, and a target redundant region is located between the two bending portions in the same pair of bending portions, and the two bending portions in the same pair of bending portions protrude towards the target redundant region.

12. The display panel of claim 11, wherein the two bending portions in the same pair of bending portions are mirror-symmetric to each other with respect to a symmetry axis extending along the second direction.

13. The display panel of claim 11, wherein a first pixel electrode has a different shape from a shape of a second pixel electrode, and the first pixel electrode and the second pixel electrode are pixel electrodes in the second pixel regions adjacent to the two bending portions in the same pair of bending portions, respectively.

14. The display panel of claim 1, wherein the display panel comprises a plurality of second pixel regions, and areas of the plurality of second pixel regions are equal to each other.

15. A display device, comprising the display panel of claim 1.

16. A method for driving the display device of claim 15, comprising:

providing light in a plurality of primary colors for the display panel during each display period of the display device; wherein the display period comprises multiple sub-phases, the backlight module is configured to emit light in different primary colors during the multiple sub-phases of a same display period, and during each of the multiple sub-phases, an sub-image in a corresponding one of the plurality of primary colors of a target image is displayed, and providing a driving signal to each of the plurality of first regions according to image information of the sub-image in the corresponding primary color of the target image during a corresponding sub-phase of the display period.

17. The method of claim 16, wherein providing the driving signal to each of the plurality of first regions according to the image information of the sub-image in the corresponding primary color of the target image during the corresponding sub-phase of the display period, comprises:
   determining, during each of the multiple sub-phases, a target luminance of each of the plurality of first regions according to the image information of the sub-image in the corresponding primary color of the target image, and
   supplying the driving signal to each of the plurality of first regions according to the target luminance of the first region.

18. The method of claim 17, wherein
   the display panel comprises at least one to-be-adjusted region, each of the to-be-adjusted regions is between the body portions of the two second signal lines and comprises n second pixel regions and m first pixel regions, wherein the m first pixel regions are on a side of the n second pixel regions along the second direction, and both of m and n are integers greater than 1, and the to-be-adjusted region is defined by the body portions of the two second signal lines and the two first signal lines,
   in response to that a portion of the sub-image corresponding to the to-be-adjusted region displays a picture with uniform gray scales, a sum of luminous fluxes of the n second pixel regions in the to-be-adjusted region is approximately equal to a sum of luminous fluxes of the m first pixel regions, or
   in response to that the portion of the sub-image corresponding to the to-be-adjusted region displays a picture with abrupt gray scales and one of the n second pixel regions is located on a boundary on which the gray scales changes significantly, a target luminance of a first target pixel region is a product of a target luminance of the second pixel region located on the boundary and a first ratio, wherein the first target pixel region is one of the m first pixel region in the to-be-adjusted region, the two second signal lines adjacent to the first target pixel region are the same as two second signal lines adjacent to the second pixel region located on the boundary, and the first ratio is a ratio of an area of the second pixel region to an area of the first pixel region.

19. A virtual reality device, comprising the display device of claim 15.

* * * * *